United States Patent
Lee et al.

(10) Patent No.: US 12,015,035 B2
(45) Date of Patent: Jun. 18, 2024

(54) METHOD OF MANUFACTURING DISPLAY DEVICE INCLUDING POSITIONED LIGHT EMITTING ELEMENTS AND DISPLAY DEVICE MANUFACTURED THEREBY

(71) Applicant: Samsung Display Co., LTD., Yongin-si (KR)

(72) Inventors: Jeong Hyun Lee, Yongin-si (KR); Jeong Nyun Kim, Yongin-si (KR); Jong Chan Lee, Yongin-si (KR); Sung Geun Bae, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 124 days.

(21) Appl. No.: 17/369,398

(22) Filed: Jul. 7, 2021

(65) Prior Publication Data
US 2022/0077201 A1 Mar. 10, 2022

(30) Foreign Application Priority Data
Sep. 9, 2020 (KR) .......................... 10-2020-0115696

(51) Int. Cl.
*H01L 27/12* (2006.01)
*G02F 1/1333* (2006.01)
(Continued)

(52) U.S. Cl.
CPC .... *H01L 27/1262* (2013.01); *G02F 1/133345* (2013.01); *G02F 1/1357* (2021.01);
(Continued)

(58) Field of Classification Search
CPC .......................... H01L 25/167; H01L 23/5386
See application file for complete search history.

(56) References Cited

U.S. PATENT DOCUMENTS

| 8,258,692 B2 | 9/2012 | Hong et al. |
| 10,658,605 B2 | 5/2020 | Lee et al. |
| 2014/0346475 A1* | 11/2014 | Cho ..................... H10K 59/131 438/4 |

FOREIGN PATENT DOCUMENTS

| KR | 10-0932989 | 12/2009 |
| KR | 10-2011-0118063 | 10/2011 |

(Continued)

OTHER PUBLICATIONS

International Search Report corresponding to International Application No. PCT/KR2021/011779 dated Dec. 9, 2021.

*Primary Examiner* — Lauren Nguyen
(74) *Attorney, Agent, or Firm* — KILE PARK REED & HOUTTEMAN PLLC

(57) ABSTRACT

A method of manufacturing a display device includes forming an uncut electrode on a substrate, at least a portion of the uncut electrode being formed in a non-emission area; disposing a first insulating layer to overlap the uncut electrode; removing at least a portion of the first insulating layer in the non-emission area; cutting the at least a portion of the uncut electrode in the non-emission area; disposing light emitting elements including a first light emitting element in an emission area and a second light emitting element in the non-emission area; and disposing a second insulating layer to overlap the emission area and the non-emission area. The second light emitting element is disposed in the non-emission area where the uncut electrode is not disposed. Also provided is a display device manufactured by the method.

14 Claims, 18 Drawing Sheets

(51) Int. Cl.
  *G02F 1/135* (2006.01)
  *G02F 1/1676* (2019.01)
  *H01L 33/00* (2010.01)
(52) U.S. Cl.
  CPC .......... *G02F 1/1676* (2019.01); *H01L 27/124* (2013.01); *H01L 33/005* (2013.01)

(56) References Cited

FOREIGN PATENT DOCUMENTS

| | | |
|---|---|---|
| KR | 10-2019-0013142 | 2/2019 |
| KR | 10-2019-0029831 | 3/2019 |
| KR | 10-2019-0038105 | 4/2019 |
| KR | 10-2020-0105598 | 9/2020 |

\* cited by examiner

FIG. 15
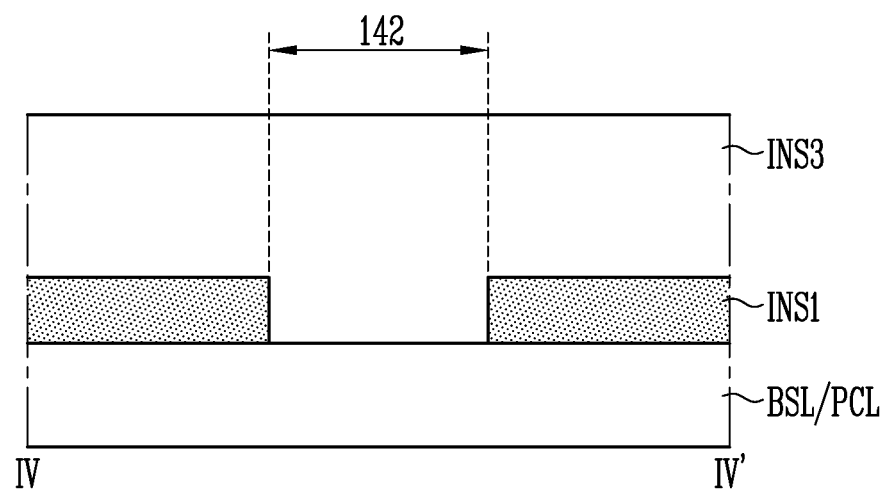
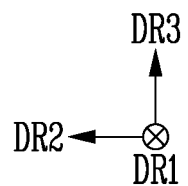

METHOD OF MANUFACTURING DISPLAY DEVICE INCLUDING POSITIONED LIGHT EMITTING ELEMENTS AND DISPLAY DEVICE MANUFACTURED THEREBY

CROSS-REFERENCE TO RELATED APPLICATION(S)

This application claims priority to and benefits of Korean patent application No. 10-2020-0115696 under 35 U.S.C. § 119 filed on Sep. 9, 2020 in the Korean Intellectual Property Office, the entire contents of which are incorporated herein by reference.

BACKGROUND

1. Technical Field

The disclosure generally relates to a method of manufacturing a display device and a display device manufactured thereby.

2. Description of the Related Art

Recently, as interest in information displays is increased, research and development of display devices have been continuously conducted.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

An object of the disclosure is to provide a method of manufacturing a display device and a display device manufactured thereby in which the reliability of optical inspection on the display device may be improved, and a short circuit defect may be prevented.

The object of the disclosure is not limited to the object described above, and other objects will be clearly understood by those skilled in the art from the following description.

In accordance with an aspect of the disclosure, a method of manufacturing a display device including an emission area and a non-emission area may include forming an uncut electrode on a substrate, wherein at least a portion of the uncut electrode may be formed in the non-emission area; disposing a first insulating layer to overlap the uncut electrode; removing at least a portion of the first insulating layer in the non-emission area; cutting the at least a portion of the uncut electrode in the non-emission area; disposing light emitting elements including a first light emitting element and a second light emitting element, wherein the first light emitting element may be disposed in the emission area and the second light emitting element may be disposed in the non-emission area; and disposing a second insulating layer to overlap the emission area and the non-emission area, wherein the second light emitting element may be disposed in the non-emission area where the uncut electrode may not be disposed.

The non-emission area may include a first area and a second area, and each of the first area and the second area may be an area in which the first insulating layer may be removed in the removing of the at least a portion of the first insulating layer.

The first area may be an area in which the at least a portion of the uncut electrode is cut in the cutting of the at least a portion of the uncut electrode, and the second area may not overlap the first area in a plan view.

The removing of the at least a portion of the first insulating layer may include removing the first insulating layer disposed in the first area; and removing the first insulating layer disposed in the second area. The disposing of the light emitting elements may be performed after the removing of the first insulating layer disposed in the second area.

The disposing of the light emitting elements may include disposing a first quantity of the second light emitting element in the first area; and disposing a second quantity of the second light emitting element in the second area. The second quantity of the second light emitting element may be greater than the first quantity of the second light emitting element.

In the disposing of the second insulating layer, the second light emitting element disposed in the second area may be overlapped by the second insulating layer.

The cutting of the at least a portion of the uncut electrode may include removing at least a portion of the uncut electrode disposed in the first area; and forming a first electrode and a second electrode that may be physically separated from each other.

In the cutting of the at least a portion of the uncut electrode, at least a portion of each of the first electrode and the second electrode may be exposed, and the second area may be opened with respect to the at least a portion of each of the first electrode and the second electrode.

The method may further include disposing a bank defining the emission area. The bank may not be disposed in the second area.

The first light emitting element may be disposed in a first direction, and the first area may overlap an area in which the first light emitting element may be disposed along the first direction.

The first area and the second area may be disposed along a second direction intersecting the first direction.

The first area and the second area may be adjacent to each other along the second direction.

The non-emission area may be disposed in an area adjacent to the second area along the second direction.

The method may further include disposing a transistor on the substrate. A position of the transistor disposed in the disposing of the transistor may not overlap the first area in a plan view.

The transistor may overlap the second area in a plan view.

In accordance with another aspect of the disclosure, a display device including an emission area and a non-emission area may include an uncut electrode disposed on a substrate, the uncut electrode including at least a portion removed in the non-emission area; a first insulating layer overlapping the uncut electrode, wherein at least a portion of the first insulating layer may be disposed in the non-emission area; light emitting elements including a first light emitting element disposed in the emission area and a second light emitting element disposed in the non-emission area; and a second insulating layer overlapping the emission area and the non-emission area, wherein the second light emitting element may be disposed in the non-emission area where the uncut electrode may not be disposed.

The means for solving the problems of the disclosure is not limited to the above-described solutions. Solutions that may not be mentioned will be clearly understood by those of ordinary skill in the art from the disclosure and the accompanying drawings.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the disclosure to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

FIGS. 14 and 15 are schematic cross-sectional views taken along line IV-IV' shown in FIG. 5.

DETAILED DESCRIPTION OF THE EMBODIMENTS

Figure 1:
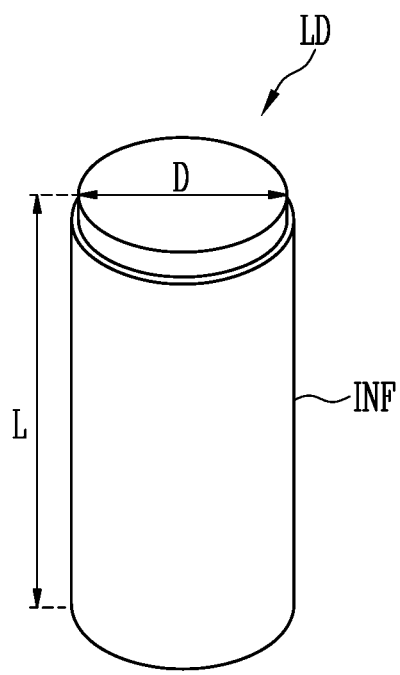
FIGS. 1 and 2 are a perspective view and a schematic cross-sectional view illustrating a light emitting element in accordance with an embodiment.

Embodiments disclosed in the specification are provided only for illustrative purposes and for full understanding of the scope of the disclosure by those skilled in the art. However, the disclosure is not limited to the embodiments, and it should be understood that the disclosure includes modifications, examples, or change examples without departing from the spirit and scope of the disclosure.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B.

The terms used in the specification have been selected as general terms currently widely used if possible considering the functions in the disclosure, but they may depend on the intentions of those skilled in the art, practice, the appearance of new technologies, etc. For example, cases may use the terms selected arbitrarily by the applicant and in these cases, their meaning will be described when describing corresponding disclosures. Thus, it should be noted that the terms used in the specification should be construed on the basis of their actual meanings and contents through the specification, not just names thereof.

The drawings attached to the specification are provided to explain the disclosure, and the shapes shown in the drawings may be exaggerated and displayed as necessary to help understanding of the disclosure, and thus the disclosure is not limited to the drawings.

While such terms as "first," "second," etc., may be used to describe various components, such components must not be limited to the above terms. The above terms are used only to distinguish one component from another.

An expression used in the singular encompasses the expression of the plural unless it has a clearly different meaning in the context.

In the specification, it is to be understood that the terms such as "comprising" or "including" or "having" and their variations are intended to indicate the existence of the features or components disclosed in the specification, and are not intended to preclude the possibility that one or more other features or components may be added.

It will be understood that when a layer, region, or component is referred to as being "formed on" or "disposed on" or "arranged on" or "located on" or "provided on" another layer, region, or component, it may be directly or indirectly formed or disposed on or arranged on or located on or provided on the other layer, region, or component. That is, for example, intervening layers, regions, or components may be present.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The disclosure generally relates to a method of manufacturing a display device and a display device manufactured thereby.

Hereinafter, a method of manufacturing a display device and a display device manufactured thereby in accordance with an embodiment will be described with reference to FIGS. 1 to 18.

Figure 2:
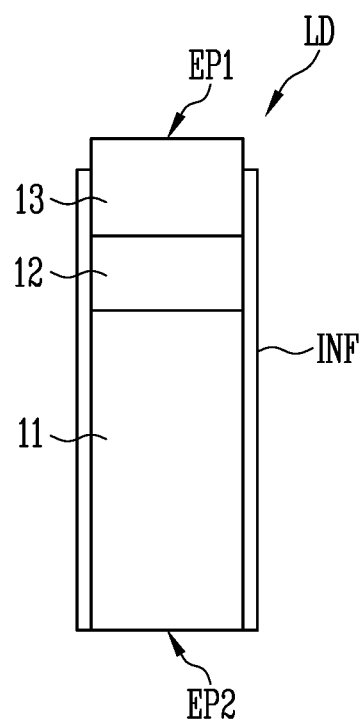

FIGS. 1 and 2 are a perspective view and a schematic cross-sectional view illustrating a light emitting element in accordance with an embodiment. Although a substantially pillar-shaped light emitting element LD is illustrated in FIGS. 1 and 2, the type and/or shape of the light emitting element LD is not limited thereto.

Referring to FIGS. 1 and 2, the light emitting element LD may include a first semiconductor layer 11, a second semiconductor layer 13, and an active layer 12 interposed between the first and second semiconductor layers 11 and 13. In an example, assuming that an extending direction of the light emitting element LD is a length L direction, the light emitting element LD may include the first semiconductor layer 11, the active layer 12, and the second semiconductor layer 13, which may be sequentially stacked along the length L direction.

The light emitting element LD may be provided in a substantially pillar shape extending along one direction. The light emitting element LD may have a first end portion EP1 and a second end portion EP2. One of the first and second semiconductor layers 11 and 13 may be disposed at the first end portion EP1 of the light emitting element LD. The other of the first and second semiconductor layers 11 and 13 may be disposed at the second end portion EP2 of the light emitting element LD.

In an embodiment, the light emitting element LD may be a light emitting element manufactured in a substantially pillar shape through an etching process, for example, within the spirit and the scope of the disclosure. In this specification, the term "pillar shape" may include a rod-like shape or bar-like shape, which may be long in the length L direction (for example, its aspect ratio may be greater than 1), such as substantially a cylinder or substantially a polyprism, and the shape of its section is not particularly limited. For example, a length L of the light emitting element LD may be greater than a diameter D (or a width of a cross-section) of the light emitting element LD.

The light emitting element LD may have a size small to a degree of a nanometer scale to a micrometer scale. In an example, the light emitting element LD may have a diameter D (or a width) in a range of a nanometer scale to a micrometer scale and/or a length L in a range of a nanometer scale to a micrometer scale. However, the size of the light emitting element LD is not limited thereto, and the size of the light emitting element LD may be variously changed according to design conditions of various types of devices, for example, a display device, and the like, which use, as a light source, a light emitting apparatus using the light emitting element LD.

The first semiconductor layer 11 may be a first conductivity type semiconductor layer. For example, the first semiconductor layer 11 may include an N-type semiconductor layer. In an example, the first semiconductor layer 11 may include any one semiconductor material from among InAlGaN, GaN, AlGaN, InGaN, AlN, and InN, and include an N-type semiconductor layer doped with a first conductivity type dopant such as Si, Ge, or Sn. However, the material constituting the first semiconductor layer 11 is not limited thereto. For example, the first semiconductor layer 11 may be configured with or formed of various materials.

The active layer 12 may be formed or disposed on the first semiconductor layer 11, and may be formed in a single-quantum well structure or a multi-quantum well (MQW) structure. The position of the active layer 12 may be variously changed according to a type of the light emitting element LD.

A clad layer (not shown) doped with a conductive dopant may be formed or disposed on the top and/or the bottom of the active layer 12. In an example, the clad layer may be formed as an AlGaN layer or InAlGaN layer. In an embodiment, a material such as AlGaN or AlInGaN may be used to form the active layer 12. For example, the active layer 12 may be configured with or formed of various materials.

The second semiconductor layer 13 may be formed or disposed on the active layer 12, and may include a semiconductor layer having a type different from that of the first semiconductor layer 11. For example, the second semiconductor layer 13 may include a P-type semiconductor layer. In an example, the second semiconductor layer 13 may include at least one semiconductor material from among InAlGaN, GaN, AlGaN, InGaN, AlN, and InN, and may include a P-type semiconductor layer doped with a second conductivity type dopant such as Mg. However, the material constituting the second semiconductor layer 13 is not limited thereto. For example, the second semiconductor layer 13 may be configured with or formed of various materials.

In a case that a voltage which is a threshold voltage or more is applied to both ends of the light emitting element LD, the light emitting element LD emits light as electron-hole pairs are combined in the active layer 12. The light emission of the light emitting element LD is controlled by using such a principle, so that the light emitting element LD may be used as a light source for various light emitting apparatuses, including a pixel of a display device.

The light emitting element LD may further include an insulative film INF provided or disposed on a surface thereof. The insulative film INF may be formed or disposed on the surface of the light emitting element LD to at least surround the outer circumference of the active layer 12. For example, the insulative film INF may further surround one or an area of each of the first and second semiconductor layers 11 and 13.

In an embodiment, the insulative film INF may expose both the end portions of the light emitting element LD. For example, the insulative film INF may expose one or an end of each of the first and second semiconductor layers 11 and 13 located at the first and second end portions EP1 and EP2 of the light emitting element LD. In an embodiment, the insulative film INF may expose a side portion of each of the first and second semiconductor layers 11 and 13 adjacent to the first and second end portions EP1 and EP2 of the light emitting element LD, which may have different polarities.

In an embodiment, the insulative film INF may include at least one insulating material from among silicon oxide (SiOx), silicon nitride (SiNx), silicon oxynitride (SiON), aluminum oxide (AlOx), and titanium dioxide (TiO$_2$), and may be configured or formed as a single layer or a multi-layer (for example, a double layer configured with or formed of aluminum oxide (AlOx) and silicon oxide (SiOx)). However, the disclosure is not necessarily limited thereto. In an embodiment, the insulative film INF may be omitted.

In a case that the insulative film INF is provided disposed to cover or overlap the surface of the light emitting element LD, by way of example, an outer circumferential surface of the active layer 12, the insulative film INF may prevent the active layer 12 from being short-circuited with a first pixel electrode, a second pixel electrode, or the like, which will be described later. Accordingly, the electrical stability of the light emitting element LD may be ensured.

Also, in a case that the insulative film INF is provided or disposed on the surface of the light emitting element LD, a surface defect of the light emitting element LD may be minimized, thereby improving the lifespan and efficiency of the light emitting element LD. For example, an unwanted short circuit may be prevented from occurring between a plurality of light emitting elements LD even in a case that the light emitting elements LD may be disposed close in proximity to each other.

In an embodiment, the light emitting element LD may further include an additional component, in addition to the first semiconductor layer 11, the active layer 12, the second semiconductor layer 13, and/or the insulative film INF surrounding the same. For example, the light emitting element LD may additionally include at least one phosphor layer, at least one active layer, at least one semiconductor layer, and/or at least one electrode layer, which may be disposed at one end or ends of the first semiconductor layer 11, the active layer 12, and/or the second semiconductor layer 13. In an example, a contact electrode layer may be disposed at each of the first and second end portions EP1 and EP2 of the light emitting element LD. Meanwhile, although the substantially pillar-shaped light emitting element LD is shown in FIGS. 1 and 2, the type, structure, and/or shape of the light emitting element LD may be variously changed. For example, the light emitting element LD may be formed in a core-shell structure having a substantially polypyramid shape.

A light emitting apparatus including the above-described light emitting element LD may be used in various kinds of devices which require a light source, including a display device. For example, a plurality of light emitting elements LD may be disposed in each pixel of a display panel, and may be used as a light source of each pixel. However, the application field of the light emitting element LD is not limited to the above-described example. For example, the light emitting element LD may be used in other types of devices that require a light source, such as a lighting device.

Figure 3:
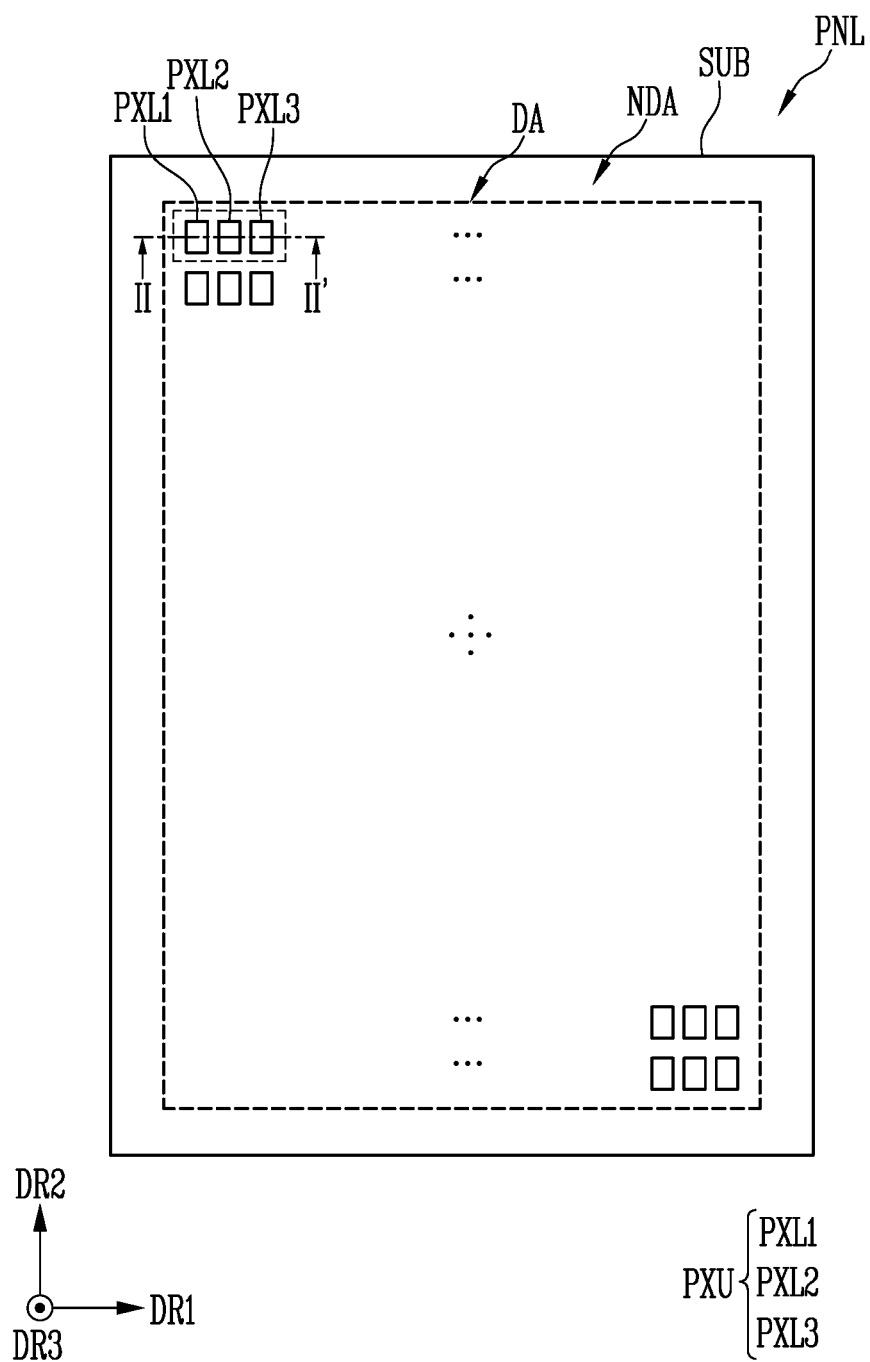
FIG. 3 is a plan view illustrating a display device in accordance with an embodiment.

FIG. 3 is a plan view illustrating a display device in accordance with an embodiment.

In FIG. 3, a display device, by way of example, a display panel PNL provided or disposed in the display device will be illustrated as an example of an electronic device which may use, as a light source, the light emitting element LD described in an embodiment shown in FIGS. 1 and 2.

Each pixel unit PXU of the display panel PNL and each pixel constituting the pixel unit PXU may include at least one light emitting element LD. For convenience, in FIG. 3, a structure of the display panel PNL will be briefly illustrated based on a display area DA. However, in an embodiment, at least one driving circuit (for example, at least one of a scan driver and a data driver), lines, and/or pads, which are not shown in the drawing, may be further disposed in the display panel PNL.

Referring to FIG. 3, the display panel PNL may include a substrate SUB and a pixel unit PXU disposed on the substrate SUB. The pixel unit PXU may include first color pixels PXL1, second color pixels PXL2, and/or third color pixels PXL3. Hereinafter, in a case that at least one pixel among the first color pixels PXL1, the second color pixels PXL2, and the third color pixels PXL3 is arbitrarily designated or in a case that two or more kinds of pixels among the first color pixels PXL1, the second color pixels PXL2 are inclusively designated, the pixel or the pixels will be referred to as a "pixel PXL" or "pixels PXL."

The substrate SUB may be used to constitute a base member of the display panel PNL, and may be a rigid or flexible substrate or a film. In an example, the substrate SUB may be a rigid substrate made of glass or tempered glass, a flexible substrate (or thin film) made of a plastic or metal material, or an insulating layer including at least one layer. The material and/or property of the substrate SUB is not particularly limited.

In an embodiment, the substrate SUB may be substantially transparent. The term 'substantially transparent' may mean that light may be transmitted with a predetermined transmittance or more. In an embodiment, the substrate SUB may be translucent or opaque. Also, the substrate SUB may include a reflective material in an embodiment.

The display panel PNL and the substrate SUB for forming the same may include a display area DA for displaying an image and a non-display area NDA surrounding or adjacent to the display area DA.

Pixels PXL may be arranged or disposed in the display area DA. Various lines, pads, and/or a built-in circuit, which may be electrically connected to the pixels PXL of the display area DA, may be disposed in the non-display area NDA. The pixels PXL may be regularly arranged or disposed in the display area DA according to a stripe structure, a PenTile® structure, or the like within the spirit and the scope of the disclosure. However, the arrangement structure of the pixels PXL is not limited thereto, and the pixels PXL may be arranged or disposed in the display area DA by using various structures and/or methods.

In an embodiment, two or more kinds of pixels PXL may emit lights of different colors. In an example, first color pixels PXL1 emitting light of a first color, second color pixels PXL2 emitting light of a second color, and third color pixels PXL3 emitting light of a third color may be arranged or disposed in the display area DA. At least one first color pixel PXL1, a least one second color pixel PXL2, and at least one third color pixel PXL3, which may be disposed adjacent to each other, may constitute one pixel unit PXU capable of emitting lights of various colors. For example, each of the first to third color pixels PXL1, PXL2, and PXL3 may be a sub-pixel emitting light of a predetermined color. In an embodiment, the first pixel PXL1 may be a red pixel emitting red light, the second pixel PXL2 may be a green pixel emitting green light, and the third pixel PXL3 may be a blue pixel emitting blue light. However, the disclosure is not limited thereto.

In an embodiment, the first color pixel PXL1, the second color pixel PXL2, and the third color pixel PXL3 respectively have, as light sources, a light emitting element of the first color, a light emitting element of the second color, and a light emitting element of the third color, so that the light emitting elements may respectively emit lights of the first color, the second color, and the third color. In an embodiment, the first color pixel PXL1, the second color pixel PXL2, and the third color pixel PXL3 may have light emitting elements emitting light of the same color, and may include color conversion layers and/or color filters of different colors, which may be disposed on the respective light emitting elements, to respectively emit lights of the first color, the second color, and the third color. However, the color, type, and/or number of pixels PXL constituting each pixel unit PXU are not particularly limited. In an example, the color of light emitted by each pixel PXL may be variously changed.

The pixel PXL may include at least one light source driven by a predetermined control signal (for example, a scan signal and a data signal) and/or a predetermined power source (for example, a first power source and a second power source). In an embodiment, the light source may include at least one light emitting element LD in accordance with an embodiment shown in FIGS. 1 and 2, for example, a subminiature substantially pillar-shaped light emitting element LD having a small size to a degree of a nanometer scale to a micrometer scale. However, the disclosure is not necessarily limited thereto. For example, various types of light emitting elements LD may be used as the light source of the pixel PXL.

In an embodiment, each pixel PXL may be configured or formed as an active pixel. However, the kind, structure, and/or driving method of pixels PXL which may be applied to the display device are not particularly limited. For example, each pixel PXL may be configured or formed as a pixel of a passive or active light emitting display device using various structures and/or driving methods.

Figure 4:
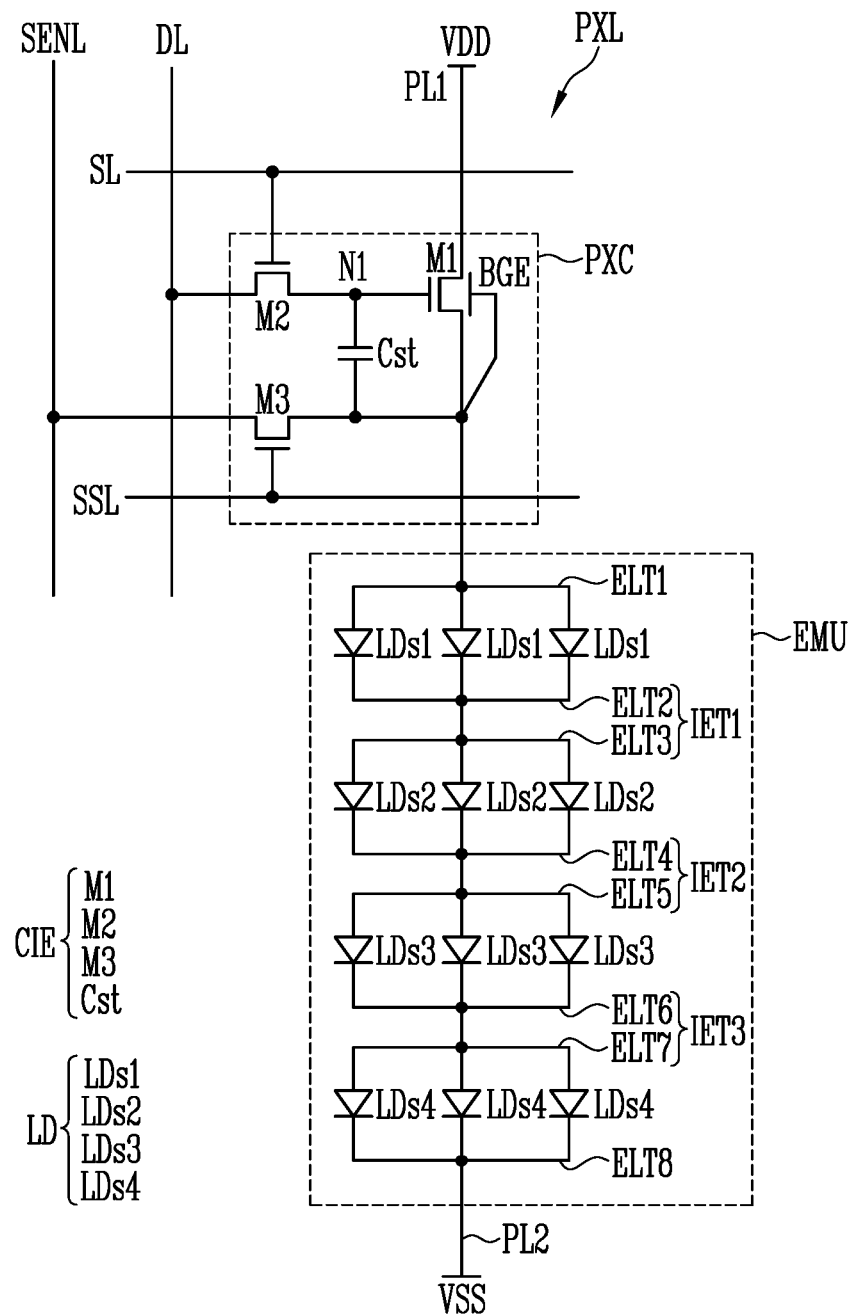
FIG. 4 is an equivalent circuit diagram illustrating a pixel in accordance with an embodiment.

FIG. 4 is an equivalent circuit diagram illustrating a pixel PXL in accordance with an embodiment. For example, FIG. 4 illustrates an embodiment of a pixel PXL which may be applied to an active display device. However, the types of the pixel PXL and the display device, to which an embodiment may be applied, are not limited thereto.

In an embodiment, the pixel PXL shown in FIG. 4 may be any one of the first color pixel PXL1, the second color pixel PXL2, and the third color pixel PXL3, which may be provided or disposed in the display panel PNL shown in FIG. 3.

Referring to FIG. 4, the pixel PXL may include a light emitting unit EMU for generating light with a luminance corresponding to a data signal. The light emitting unit EMU may include a light emitting element LD. The light emitting element LD may include a first light emitting element LDs1, a second light emitting element LDs2, a third light emitting element LDs3, and a fourth light emitting element LDs4. The pixel PXL may include a pixel circuit PXC capable of driving the light emitting unit EMU.

The light emitting unit EMU may include light emitting elements LD electrically connected between a first power source VDD and a second power source VSS. A first end portion (for example, a P-type end portion) of the light emitting elements LD may be electrically connected to the first power source VDD via the pixel circuit PXC, a first power line PL1, and the like, and a second end portion (for example, an N-type end portion) of the light emitting elements LD may be electrically connected to the second power source VSS via a second power line PL2 and the like within the spirit and the scope of the disclosure.

In an embodiment, the light emitting elements LD may be electrically connected to each other through various connection structures between the first power source VDD and the second power source VSS. In an example, the light emitting elements may be electrically connected only in parallel to each other, or may be electrically connected only in series to each other. Alternatively, the light emitting elements LD may be electrically connected in a series/parallel hybrid structure.

For example, the light emitting elements LD may be divided into four serial stages to be electrically connected in series/parallel to each other as shown in FIG. 4. Each serial stage may include a pair of electrodes (for example, two electrodes) and at least one light emitting element LD electrically connected between the pair of electrodes. The numbers of light emitting elements LD constituting the respective serial stage may be equal to or different from each other, and a number of light emitting elements LD is not particularly limited.

For example, a first serial stage may include a first electrode ELT1, a second electrode ELT2, and at least one light emitting element LDs1 electrically connected between the first and second electrodes EL1 and EL2, and a second serial stage may include a third electrode ELT3, a fourth electrode ELT4, and at least one light emitting element LDs2 electrically connected between the third and fourth electrodes ELT3 and ELT4. Similarly, a third serial stage may include a fifth electrode ELT5, a sixth electrode ELT6, and at least one light emitting element LDs3 electrically connected between the fifth and sixth electrodes ELT5 and ELT6, and a fourth serial stage may include a seventh electrode ELT7, an eighth electrode ELT8, and at least one light emitting element LDs4 electrically connected between the seventh and eighth electrodes ELT7 and ELT8.

The first electrode ELT1 may be a first pixel electrode (or anode electrode) of the light emitting unit EMU. For example, the last electrode, for example, the eighth electrode ELT8 of the light emitting unit EMU may be a second pixel electrode (or cathode electrode) of the light emitting unit EMU.

Each of the second to seventh electrodes ELT2 to ELT7 may constitute an intermediate electrode. For example, the second electrode ELT2 and the third electrode ELT3 may be integrally or non-integrally connected to each other to constitute a first intermediate electrode IET1. Similarly, the fourth electrode ELT4 and the fifth electrode ELT5 may be integrally or non-integrally connected to each other to constitute a second intermediate electrode IET2, and the sixth electrode ELT6 and the seventh electrode ELT7 may be integrally or non-integrally connected to each other to constitute a third intermediate electrode IET3. The second and third electrodes ELT2 and ELT3 may be integrally connected as one first intermediate electrode IET1, the fourth and fifth electrodes ELT4 and ELT5 may be integrally connected as one second intermediate electrode IET2, and the sixth and seventh electrode ELT6 and ELT7 may be integrally connected as one third intermediate electrode IET3.

Although an embodiment in which the light emitting elements LD may be electrically connected in a four-stage series/parallel hybrid structure has been illustrated in FIG. 4, the disclosure is not limited thereto. For example, the light emitting elements LD may be electrically connected in a two-stage series or series/parallel hybrid structure, or may be electrically connected in a four or more-stage series or series/parallel hybrid structure.

Also, although an embodiment in which the light emitting elements LD may be electrically connected in a series/parallel hybrid structure has been illustrated in FIG. 4, the disclosure is not limited thereto. For example, the light emitting elements LD provided or disposed in the light emitting unit EMU of each pixel PXL may be electrically connected only in series or parallel.

Each of the light emitting elements LD may include a first end portion (for example, a P-type end portion) electrically connected to the first power source VDD via the first pixel electrode (for example, the first electrode ELT1), the pixel circuit PXC, and/or the first power line PL1, and a second end portion (for example, an N-type end portion) electrically connected to the second power source VSS via the second pixel electrode (for example, the eighth electrode ELT8) and the second power line PL2. For example, the light emitting elements LD may be electrically connected in a forward direction between the first power source VDD and the second power source VSS. Each of the light emitting elements LD electrically connected in the forward direction may form an effective light source, and the effective light sources may constitute the light emitting unit EMU of the pixel PXL.

The first power source VDD and the second power source VSS may have different potentials such that the light emitting elements LD may emit light. In an example, the first power source VDD may be set as a high-potential power source, and the second power source VSS may be set as a low-potential power source. The first power source VDD and the second power source VSS may have a potential difference to a degree to which the light emitting elements LD may emit light during an emission period of the pixel PXL.

In a case that a driving current is supplied through the corresponding pixel circuit PXC, the light emitting elements LD may emit light with a luminance corresponding to the driving current. For example, during each frame period, the pixel circuit PXC may supply, to the light emitting unit EMU, a driving current corresponding to a grayscale value to be expressed in a corresponding frame. Accordingly, while the light emitting elements LD emit light with the luminance corresponding to the driving current, the light emitting unit EMU may express the luminance corresponding to the driving current.

In an embodiment, the light emitting unit EMU may further include at least one ineffective light source in addition to the light emitting elements LD forming the respective effective light sources. In an example, at least one ineffective light emitting element which may be arranged or disposed in a reverse direction or has at least one floated end portion may be further electrically connected in at least one serial stage. The ineffective light emitting element maintains a non-activated state even in a case that a predetermined driving voltage (for example, a forward driving voltage) is applied between the first and second pixel electrodes. Accordingly, the ineffective light emitting element may substantially maintain a non-emission state.

The pixel circuit PXC may be electrically connected between the first power source VDD and the light emitting unit EMU. The pixel circuit PXC may be electrically connected to a scan line SL and a data line of the corresponding pixel PXL. Also, the pixel circuit PXC may be selectively further electrically connected to a sensing signal line SSL and a sensing line SENL.

The pixel circuit PXC may include a first transistor M1, a second transistor M2, a third transistor M3, and a storage capacitor Cst. Hereinafter, the first to third transistors M1 to M3 and the storage capacitor Cst may be comprehensively defined as a circuit element CIE.

The first transistor M1 may be electrically connected between the first power source VDD and the first electrode ELT1 of the light emitting unit EMU. For example, a gate electrode of the first transistor M1 may be electrically connected to a first node N1. The first transistor M1 may control a driving current supplied to the light emitting unit EMU, corresponding to a voltage of the first node N1. For example, the first transistor M1 may be a driving transistor for controlling the driving current of the pixel PXL.

Also, the first transistor M1 may selectively further include a back gate electrode BGE electrically connected to the first electrode ELT1. The back gate electrode BGE may be disposed to overlap the gate electrode with an insulating layer interposed therebetween.

The second transistor M2 may be electrically connected between the data line DL and the first node N1. For example, a gate electrode of the second transistor M2 may be electrically connected to the scan line SL. The second transistor M2 may be turned on in a case that a scan signal having a gate-on voltage (for example, a high level voltage) is supplied from the scan line SL, to electrically connect the data line DL and the first node N1.

A data signal of a corresponding frame may be supplied to the data line for each frame period. The data signal may be transferred to the first node N1 through the turned-on second transistor M2 during a period in which the scan signal having the gate-on voltage is supplied. For example, the second transistor M2 may be a switching transistor for transferring each data signal to the inside of the pixel PXL.

One or an electrode of the storage capacitor Cst may be electrically connected to the first node N1, and the other or another electrode of the storage capacitor Cst may be electrically connected to the first electrode ELT1 of the light emitting unit EMU (or a second electrode of the first transistor M1). The storage capacitor Cst may charge a voltage corresponding to the data signal supplied to the first node N1 during each frame period.

The third transistor M3 may be electrically connected between the first electrode ELT1 of the light emitting unit EMU and the sensing line SENL. For example, a gate electrode of the third transistor M3 may be electrically connected to the sensing signal line SSL. The third transistor M3 may transfer a voltage value applied to the first electrode ELT1 of the light emitting unit EMU (or a voltage value applied to an anode electrode of the light emitting element LD) to the sensing line SENL according to a sensing signal supplied to the sensing signal line SSL during a predetermined sensing period. The voltage value transferred through the sensing line SENL may be provided to an external circuit (for example, a timing controller), the external circuit may extract characteristic information (for example, a threshold voltage of the first transistor M1, for example) of each pixel PXL, based on the provided voltage value. The extracted characteristic information may be used to convert input image data such that a characteristic deviation between the pixels PXL may be compensated.

Meanwhile, although a case where the transistors, for example, the first, second, and third transistors M1, M2, and M3 included in the pixel circuit PXC are all implemented with an N-type transistor has been illustrated in FIG. 4, the disclosure is not limited thereto. For example, at least one of the first, second, and third transistors M1, M2, and M3 may be changed to a P-type transistor. In an embodiment, the pixel circuit PXC may include a combination of P-type and N-type transistors. For example, some or a number of the transistors included in the pixel circuit PXC may be implemented with the P-type transistor, and the other may be implemented with the N-type transistor. The voltage level of a control signal (for example, a scan signal, a data signal, and/or a sensing signal) for driving each transistor may be adjusted according to a type of the transistors.

For example, the structure and driving method of the pixel PXL may be variously changed in an embodiment. For example, the pixel circuit PXC may be configured or formed as a pixel circuit having various structures and/or various driving methods, in addition to the embodiment shown in FIG. 4.

In an example, the pixel circuit PXC may not include the third transistor M3. Also, the pixel circuit PXC may further include additional circuit elements such as a transistor for compensating for the threshold voltage of the first transistor M1, for example, a transistor for initializing the voltage of the first node N1 or the first electrode ELT1 of the light emitting unit EMU, a transistor for controlling a period in which a driving current may be supplied to the light emitting unit EMU, and/or a boosting capacitor for boosting the voltage of the first node N1.

In an embodiment, in a case that each pixel PXL is provided in a passive light emitting element, for example, the pixel circuit PXC may be omitted. For example, each of the first and second pixel electrodes of the light emitting unit EMU may be directly electrically connected to the scan line SL, the data line DL, the first power line PL1, the second power line PL2, or another signal line or a power line.

Figure 5:
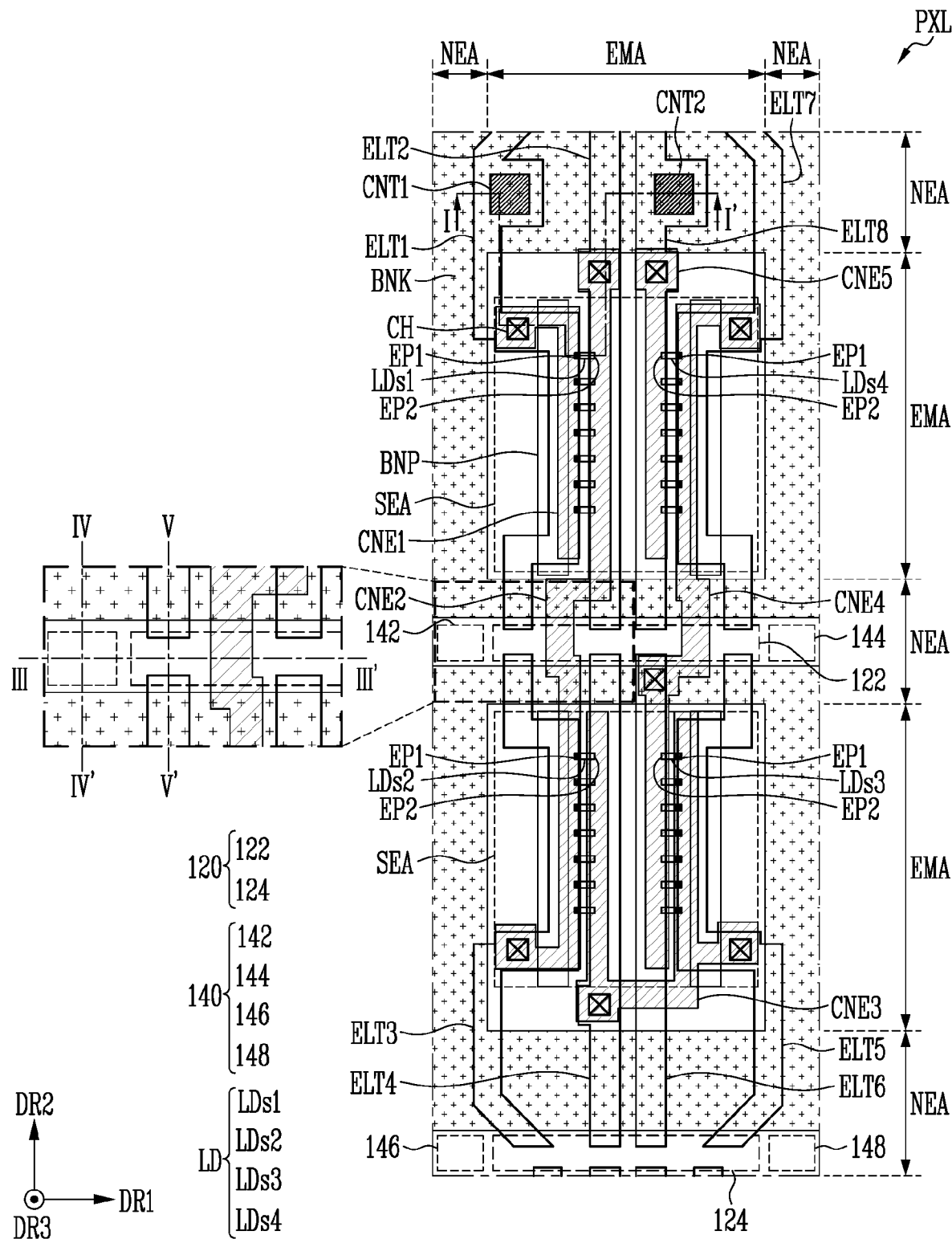
FIG. 5 is a plan view illustrating a pixel in accordance with an embodiment.

FIG. 5 is a plan view illustrating a pixel PXL in accordance with an embodiment. The pixel PXL shown in FIG. 5 may be at least one of the first color pixel PXL1, the second color PXL2, and the third color pixel PXL3.

Referring to FIG. 5, the pixel PXL may include first to eighth electrodes ELT1 to ELT8 and first to fourth light emitting elements LDs1 to LDs4.

A pair of electrodes constituting each serial stage among the first to eighth electrodes ELT1 to ELT8 may be disposed adjacent to an area in which a light emitting element LD may be arranged or disposed. Each of the first to eighth electrodes ELT1 to ELT8 may extend along a second direction DR2, and may be disposed to be spaced apart from each other along a first direction DR1.

The first light emitting element LDs1 may be disposed between the first electrode ELT1 and the second electrode ELT2. The second light emitting element LDs2 may be disposed between the third electrode ELT3 and the fourth electrode ELT4. The third light emitting element LDs3 may be disposed between the fifth electrode ELT5 and the sixth electrode ELT6. The fourth light emitting element LDs4 may be disposed between the seventh electrode ELT7 and the eighth electrode ELT8.

The first to fourth light emitting elements LDs1 to LDs4 may be located or disposed in sub-emission areas SEA in a plan view. The sub-emission areas SEA may mean an emission area EMA of any one of the first to third pixels PXL1 to PXL3. Each of the first to fourth light emitting elements LDs1 to LDs4 may be arranged or disposed along the second direction DR2 in a plan view. For example, the first light emitting element LDs1 may be configured with or formed of a plurality of light emitting elements, and the plurality of first light emitting elements LDs1 may be located or disposed along the second direction DR2 in the sub-emission area SEA.

The first to eighth electrodes ELT1 to ELT8 may be pixel electrodes of each pixel PXL. After a portion of any one of the first to eighth electrodes ELT1 to ELT8 is formed as an alignment line, the portion may be cut between the pixel PXL and an adjacent pixel PXL and/or between the sub-emission areas SEA of the pixel PXL, thereby being separated into the pixel electrodes.

For example, the first to eighth electrodes ELT1 to ELT8 may be provided by forming an uncut electrode (see 'ELT0' shown in FIG. 10) and then removing a portion of the uncut electrode ELT0 located in a cut area 120. The cut area 120 may be an area in which the uncut electrode ELT0 is cut, and may be located between adjacent sub-emission areas SEA.

The uncut electrode ELT0 may mean an electrode component of which at least a partial area is cut so as to form pixel electrodes. In an example, the uncut electrode ELT0 may mean an electrode in which any two electrodes among the first to eighth electrodes ELT1 to ELT8 may be connected to each other, before a cutting process is performed such that at least one of the first to eighth electrodes ELT1 to ELT8 serves as a pixel electrode. For example, the uncut electrode ELT0 may mean at least one of an electrode component before the first electrode ELT1 and the third electrode ELT3 are separated from each other, an electrode component before the second electrode ELT2 and the fourth electrode ELT4 are separated from each other, an electrode component before the fifth electrode ELT5 and the seventh electrode ELT7 are separated from each other, and an electrode component before the sixth electrode ELT6 and the eighth electrode ELT8 are separated from each other.

The cut area 120 may include a non-emission area NEA. The cut area 120 may include a first cut area or region 122 and a second cut area or region 124. For example, the first electrode ELT1 and the third electrode ELT3 may be physically connected to each other before cutting on the uncut electrode ELT0 is performed in the first cut area or region 122. In a case that at least a portion of the uncut electrode ELT0 in the first cut area 122 or region is removed, the first electrode ELT1 and the third electrode ELT3 may be physically spaced apart from each other. As a result, the first electrode ELT1 and the third electrode ELT3 may serve as pixel electrodes. Similarly, in a case that at least a portion of the uncut electrode ELT0 in the first cut area or region 122 is removed, the second electrode ELT2 and the fourth electrode ELT4 may be physically spaced apart from each other, the fifth electrode ELT5 and the seventh electrode ELT7 may be physically spaced apart from each other, and the sixth electrode ELT6 and the eighth electrode ELT8 may be physically spaced apart from each other.

In the cut area 120, any circuit element CIE may not be disposed in a plan view. For example, any circuit element CIE may not be arranged or disposed or located in the cut area 120 so as to prevent damage of the circuit element CIE due to a process of cutting at least a portion of the uncut electrode ELT0.

The pixel PXL may include an open area 140 in a plan view. The open area 140 may be included in the non-emission area NEA.

The open area 140 may be an area in which an insulating layer is removed in a case that a cutting process on the uncut electrode ELT0 is performed, and may mean an area in which the uncut electrode ELT0 may not be located. For example, the open area 140 may include a first open area 142 and a second open area 144, which may not overlap the first cut area or region 122 when viewed in a plan view, and may be adjacent to the first cut area or region 122. Also, the open area 140 may include a third open area 146 and a fourth open area 148, which may not overlap the second cut area or region 124 when viewed in a plan view, and may be adjacent to the second cut area or region 124.

The open area 140 may be arranged or disposed while being adjacent to the cut area 120 along the first direction DR1. The non-emission area NEA may be located in an area adjacent to the open area 140 along the second direction DR2. Any bank BNK may not located in the open area 140.

The cut area 120 and the open area 140 will be described in detail later with reference to FIGS. 9 to 18, and therefore, overlapping descriptions may be omitted.

Any one of the pixel electrodes, for example, the first electrode ELT1 may be electrically connected to the pixel circuit PXC and/or the first power line PL1 through a first contact part CNT1. Another of the pixel electrodes, for example, the eighth electrode ELT8 may be electrically connected to the second power line PL2 through a second contact part CNT2.

A bank pattern BNP may be disposed on the bottom of each of the first to eighth electrodes ELT1 to ELT8. The first to eighth electrodes ELT1 to ELT8 may protrude in a third direction DR3 due to the bank pattern BNP, to reflect light emitted from the light emitting element LD. Accordingly, the light emission efficiency of the pixel PXL may be improved.

The first to eighth electrodes ELT1 to ELT8 may be directly electrically connected to the light emitting element LD, or may be electrically connected to the light emitting element LD through a separate contact electrode (for example, first and second contact electrodes CNE1 and CNE2).

Electrodes respectively disposed in adjacent sub-emission areas SEA may be electrically connected to each other by at least one contact electrode. To this end, each pixel PXL may include first to fifth contact electrodes CNE1 to CNE5. For example, referring to FIG. 5, the second electrode ELT2 and the third electrodes ELT3 may be electrically connected to each other by the second contact electrode CNE2.

The first contact electrode CNE1 may be disposed on the first light emitting element LDs1 of the first serial stage and the first electrode ELT1, to electrically connect the first light emitting element LDs1 of the first serial stage to the first electrode ELT1.

The second contact electrode CNE2 may be disposed on the first light emitting element LDs1 of the first serial stage and the second electrode ELT2, to electrically connect the first light emitting element LDs1 of the first serial stage to the second electrode ELT2. Also, the second contact electrode CNE2 may be disposed on the second light emitting element LDs2 of the second serial stage and the third electrode ELT3, to electrically connect the second light emitting element LDs2 of the second serial stage to the third electrode ELT3.

The third contact electrode CNE3 may be disposed on the second light emitting element LDs2 of the second serial stage and the fourth electrode ELT4, to electrically connect the second light emitting element LDs2 of the second serial stage to the fourth electrode ELT4. Also, the third contact electrode CNE3 may be disposed on the third light emitting element LDs3 of the third serial stage and the fifth electrode ELT5, to electrically connect the third light emitting element LDs3 of the third serial stage to the fifth electrode ELT5.

The fourth contact electrode CNE4 may be disposed on the third light emitting element LDs3 of the third serial stage and the sixth electrode ELT6, to electrically connect the third light emitting element LDs3 of the third serial stage to the sixth electrode ELT6. Also, the fourth contact electrode CNE4 may be disposed on the fourth light emitting element LDs4 of the fourth serial stage and the seventh electrode ELT7, to electrically connect the fourth light emitting element LDs4 of the fourth serial stage to the seventh electrode ELT7.

The fifth contact electrode CNE5 may be disposed on the fourth light emitting element LDs4 of the fourth serial stage and the eighth electrode ELT8, to electrically connect the fourth light emitting element LDs4 of the fourth serial stage to the eighth electrode ELT8.

At least one insulating layer may be interposed between any one of the first to fifth contact electrodes CNE1 to CNE5 and any one of the first to eighth electrodes ELT1 to ELT8, and each contact electrode CNE and an electrode corresponding thereto may be electrically connected to each other through a contact hole CH formed in the insulating layer. However, the connection structure between the first to fifth contact electrodes CNE1 to CNE5 and the electrodes may be variously changed in an embodiment.

Figure 6:
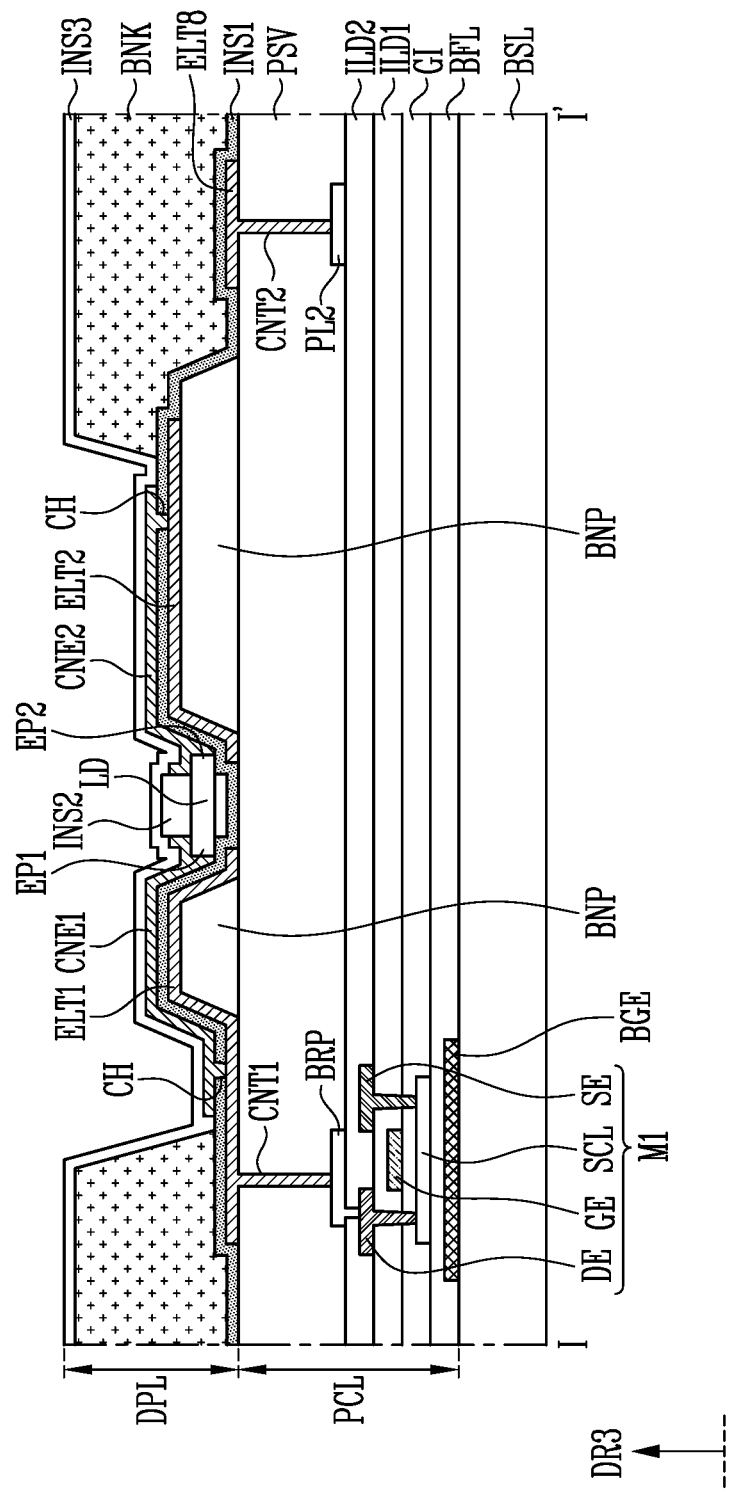
FIG. 6 is a schematic cross-sectional view taken along line I-I' shown in FIG. 5.

FIG. 6 is a schematic cross-sectional view taken along line I-I' shown in FIG. 5.

Referring to FIG. 6, the pixel PXL may include a base layer BSL, a pixel circuit layer PCL, and a display element layer DPL. In FIG. 6, for convenience of description, the pixel PXL will be described based on a configuration of a transistor corresponding to the first transistor M1 among the transistors shown in FIG. 4.

The base layer BSL may be a rigid or flexible substrate. In an example, the base layer BSL may include a rigid material or a flexible material. The base layer BSL may be the substrate SUB described with reference to FIG. 3. In an example, the flexible material may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material of the base layer BSL, which is applied to an embodiment, is not limited to any specific example.

The pixel circuit layer PCL may include a buffer layer BFL, a back gate electrode BGE, a first transistor M1, a gate insulating layer GI, a first interlayer insulating layer ILD1, a second interlayer insulating layer ILD2, a bridge pattern BRP, a second power line PL2, a first contact part CNT1, a second contact part CNT2, and a protective layer PSV.

The buffer layer BFL may be located or disposed on the base layer BSL. The buffer layer BFL may prevent an impurity from being diffused from the outside. The buffer layer BFL may include at least one of silicon nitride (SiNx), silicon oxide (SiOx), silicon oxynitride (SiOxNy), and a metal oxide such as aluminum oxide (AlOx).

The back gate electrode BGE may be located or disposed on the buffer layer BFL. The back gate electrode BGE may overlap a gate electrode GE in a plan view.

The first transistor M1 may be a thin film transistor. In an example, the first transistor M1 may be a driving transistor. The first transistor M1 may include a semiconductor layer SCL, the gate electrode GE, a source electrode SE, and a drain electrode DE.

The semiconductor layer SCL may be located or disposed on the buffer layer BFL. The semiconductor layer SCL may include at least one of poly-silicon, amorphous silicon, and an oxide semiconductor.

The semiconductor layer SCL may include a first contact region in electrical contact with the source electrode SE and a second contact region in electrical contact with the drain electrode DE.

The first contact region and the second contact region may correspond to a semiconductor pattern doped with an impurity. A region between the first contact region and the second contact region may be a channel region. The channel region may correspond to an intrinsic semiconductor pattern undoped with the impurity.

The gate insulating layer GI may be provided disposed over the semiconductor layer SCL. The gate insulating layer GI may include an inorganic material. In an example, the gate insulating layer GI may include at least one of silicon nitride (SiNx), silicon oxide (SiOx), silicon oxynitride (SiOxNy), and aluminum oxide (AlOx). In an embodiment, the gate insulating layer GI may include an organic material.

The gate electrode GE may be located or disposed on the gate insulating layer GI. A position of the gate electrode GE may correspond to that of the channel region of the semiconductor layer SCL. For example, the gate electrode GE may be disposed on the channel region of the semiconductor layer SCL with the gate insulating layer GI interposed therebetween.

The first interlayer insulating layer ILD1 may be located or disposed over the gate electrode GE. Like the gate insulating layer GI, the first interlayer insulating layer ILD1 may include at least one of silicon nitride (SiNx), silicon oxide (SiOx), silicon oxynitride (SiOxNy), and aluminum oxide (AlOx).

The source electrode SE and the drain electrode DE may be located or disposed on the first interlayer insulating layer ILD1. The source electrode SE may penetrate the gate insulating layer GI and the first interlayer insulating layer ILD1 and may be in electrical contact with the first contact region of the semiconductor layer SCL. The drain electrode DE may penetrate the gate insulating layer GI and the first interlayer insulating layer ILD1 and may be in electrical contact with the second contact region of the semiconductor layer SCL.

The second interlayer insulating layer ILD2 may be located or disposed over the source electrode SE and the drain electrode DE. Like the first interlayer insulating layer ILD1 and the gate insulating layer GI, the second interlayer insulating layer ILD2 may include an inorganic material. The inorganic material may include at least one of the materials constituting the first interlayer insulating layer ILD1 and the gate insulating layer GI, for example, silicon nitride (SiNx), silicon oxide (SiOx), silicon oxynitride (SiOxNy), and aluminum oxide (AlOx). In an embodiment, the second interlayer insulating layer ILD2 may include an organic material.

The bridge pattern BRP may be located or disposed on the second interlayer insulating layer ILD2. The bridge pattern BRP may be electrically connected to the drain electrode DE through a contact hole penetrating the second interlayer insulating layer ILD2. The second power line PL2 may be disposed on the second interlayer insulating layer ILD2. The second power line PL2 may be electrically connected to an eighth electrode ELT8 through the second contact part CNT2.

The protective layer PSV may be located or disposed on the second interlayer insulating layer ILD2. The protective layer PSV may cover or overlap the bridge pattern BRP and the second power line PL2.

The protective layer PSV may be provided in a form including an organic insulating layer, an inorganic insulating layer, or the organic insulating layer disposed on the inorganic insulating layer.

The protective layer PSV may include the first contact part CNT1 electrically connected to one or a region of the bridge pattern BRP and the second contact part CNT2 may be electrically connected to one or a region of the second power line PL2.

The display element layer DPL may include a first electrode ELT1, a second electrode ELT2, the eighth electrode ELT8, a first insulating layer INS1, a second insulating layer INS2, a third insulating layer INS3, a contact hole CH, a bank pattern BNP, a first contact electrode CNE1, a second contact electrode CNE2, a light emitting element LD, and a bank BNK.

The first electrode ELT1 may be arranged or disposed on the protective layer PSV and the bank pattern BNP. The first electrode ELT1 may be electrically connected to the first contact part CNT1, to form a path through which a voltage is applied from the first power source VDD. The second electrode ELT2 may be arranged or disposed on the protective layer PSV and the bank pattern BNP. The second electrode ELT may form a path through which a voltage is applied from the second power source VSS. The eighth electrode ELT8 may be arranged or disposed on the protective layer PSV. The eighth electrode ELT8 may be electrically connected to the second power line PL2 through the second contact part CNT2.

At least a portion of each of the first electrode ELT1 and the second electrode ELT2 may be arranged or disposed on one or a surface of the bank pattern BNP, which may face the light emitting element LD. Accordingly, the first electrode ELT1 and the second electrode ELT2 may reflect light emitted from the light emitting element LD in a display direction of the display device, thereby improving the light emission efficiency of the light emitting element LD. The display direction may mean the third direction D3.

At least one portion of the first insulating layer INS1 may be located or disposed on the protective layer PSV, and at least another portion of the first insulating layer INS1 may be located or disposed on the first electrode ELT1 and the second electrode ELT2. The first insulating layer INS1 may be disposed on the first electrode ELT1 and the second electrode ELT2, to stabilize electrical connection and to reduce external influence.

Like the second interlayer insulating layer ILD2, the first insulating layer INS1 may include at least one of silicon nitride (SiNx), silicon oxide (SiOx), silicon oxynitride (SiOxNy), and aluminum oxide (AlOx).

The bank BNK may be a structure defining or forming the emission area EMA of the pixel PXL. The emission area EMA may mean an area in which light is emitted from the light emitting element LD. For example, the bank BNK may be disposed in a boundary area between adjacent light emitting elements LD to surround the light emitting element LD of the pixel PXL.

The bank BNK may include at least one of an organic material and an inorganic material.

The first contact electrode CNE1 and the second contact electrode CNE2 may be located or disposed on the first insulating layer INS1. The first contact electrode CNE1 may be electrically connected to the first electrode ELT1 through a contact hole CH formed in the first insulating layer INS1, and the second contact electrode CNE2 may be electrically connected to the second electrode ELT2 through a contact hole CH formed in the first insulating layer INS1. Each of the first contact electrode CNE1 and the second contact electrode CNE2 may be electrically connected to the light emitting element LD.

As a result, an electrical signal provided through the first electrode ELT1 may be provided to the light emitting element LD through the first contact electrode CNE1, and an electrical signal provided through the second electrode ELT2 may be provided to the light emitting element LD through the second contact electrode CNE2.

The bank pattern BNP may have a shape protruding in an upper direction (in an example, the upper direction may mean the third direction DR3). The bank pattern BNP may be arranged or disposed in a shape surrounding an area in which the light emitting element LD may be arranged or disposed, in a plan view.

In an example, like the bank BNK, the bank pattern BNP may include at least one of an organic material and an inorganic material.

The second insulating layer INS2 may be located or disposed on the light emitting element LD. The second insulating layer INS2 may cover or overlap the active layer 12 of the light emitting element LD, which is described with reference to FIG. 2. At least a portion of the second insulating layer INS2 may be located or disposed on a rear surface of the light emitting element LD. The second insulating layer INS2 formed or disposed on the rear surface of the light emitting element LD may fill an empty gap between the first insulating layer INS1 and the light emitting element LD in a process of forming the second insulating layer INS2 on the light emitting element LD.

The second insulating layer INS2 may include at least one of an organic material and an inorganic material. In a case that the second insulating layer INS2 may include an organic material, the second insulating layer INS2 may be an organic insulating layer.

The third insulating layer INS3 may be arranged or disposed on the bank BNK, the second insulating layer INS2, the first contact electrode CNE1, and the second contact electrode CNE2. For example, the third insulating layer INS3 may cover or overlap an outermost portion of the display element layer DPL, and protect the components of the display element layer DPL from external influence.

The third insulating layer INS3 may include an organic material or an inorganic material. For example, the third insulating layer INS3 may include any one of the materials listed with reference to the first insulating layer INS1.

Hereinafter, a light control part and an upper substrate UPL, which are provided or disposed in the display device in accordance with an embodiment will be described with reference to FIGS. 7 and 8. However, for convenience of description, detailed structures and overlapping descriptions of the pixel circuit layer PCL and the display element layer DPL will be omitted, and a structure including the light control part LCP will be described in detail.

Figure 7:
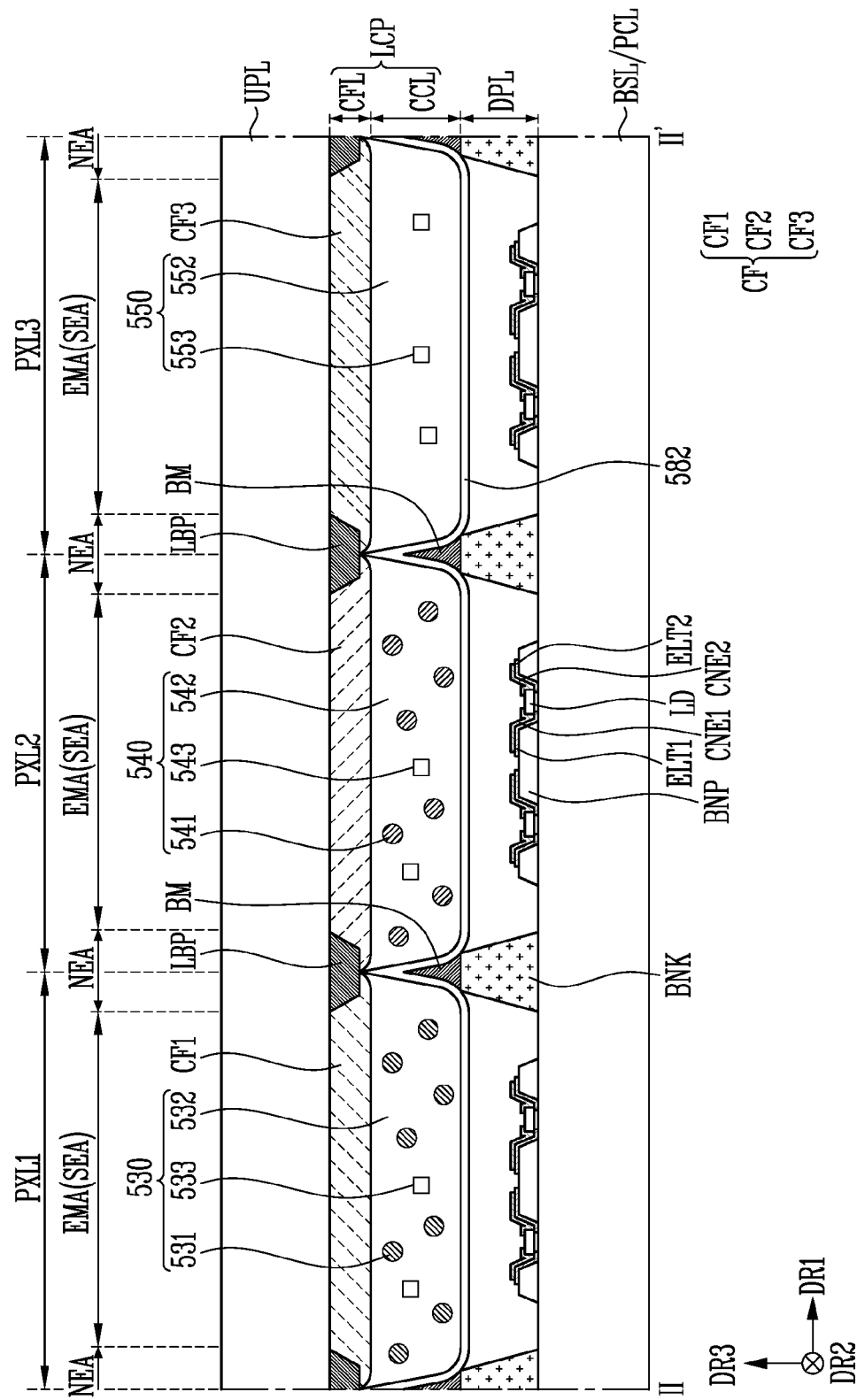
FIGS. 7 and 8 are schematic cross-sectional views taken along line II-II' shown in FIG. 3.
Figure 8:
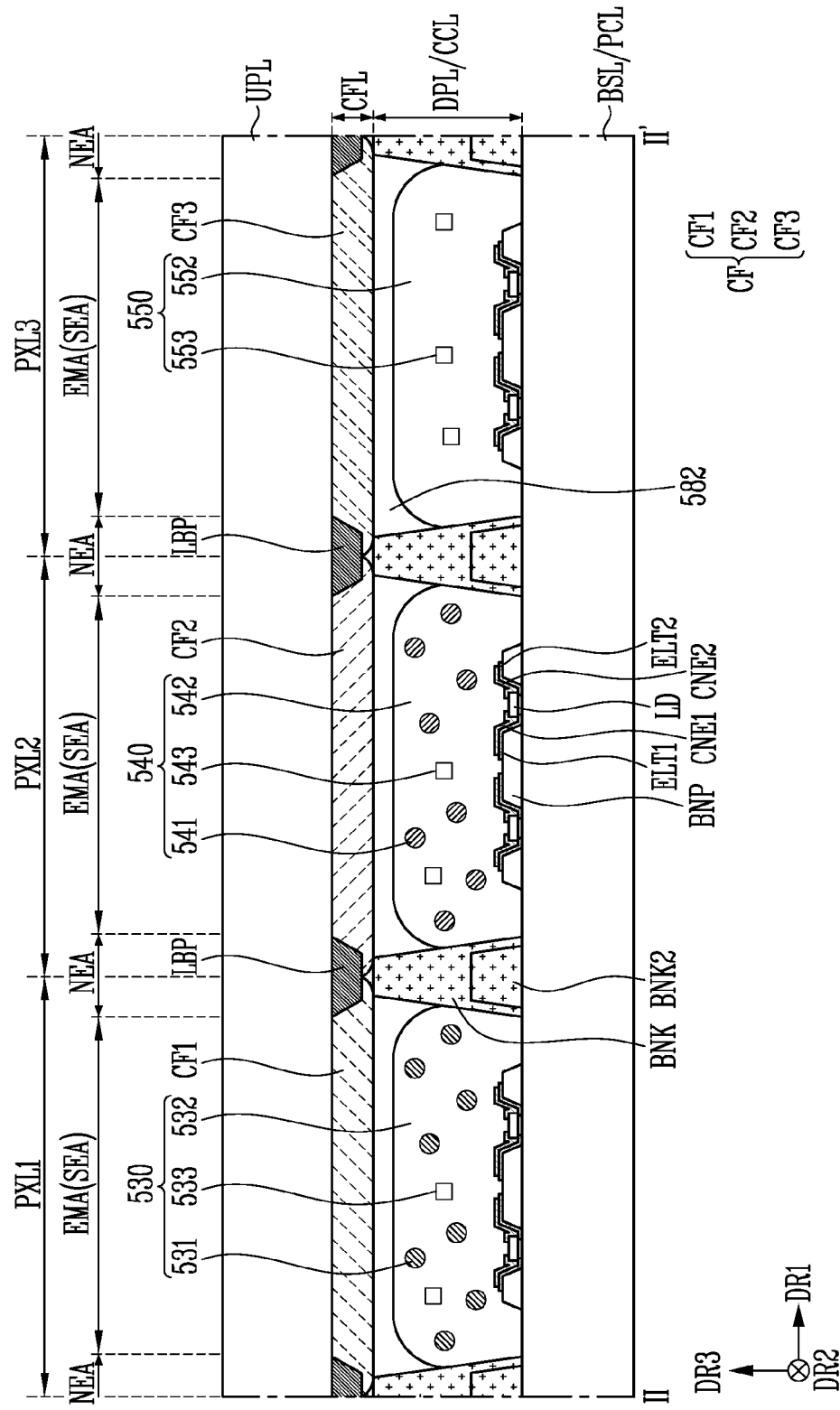

FIGS. 7 and 8 are sectional views taken along line II-II' shown in FIG. 3.

Referring to FIGS. 7 and 8, a color conversion layer CCL may include a black matrix BM, a plurality of wavelength conversion patterns 530 and 540, and a first light transmission pattern 550. The plurality of wavelength conversion patterns 530 and 540 may include a first wavelength conversion pattern 530 and a second wavelength conversion pattern 540.

The black matrix BM may be located between a color filter layer CFL and the display element layer DPL in a non-emission area NEA. The black matrix BM may define or form the emission area EMA and the non-emission area NEA.

The emission area EMA may mean an area in which light is emitted, and the non-emission area NEA may mean an area in which no light is emitted. For example, an area in which the black matrix BM is disposed may correspond to the non-emission area NEA in which no light is emitted. The black matrix BM may include a light blocking material and/or a reflective material.

The first wavelength conversion pattern 530 may be located in the emission area EMA of the first pixel PXL1 in a plan view.

The first wavelength conversion pattern 530 may include a first wavelength conversion material 531, a first base resin 532, and a first scattering material 533.

The first wavelength conversion material 531 may convert a peak wavelength of incident light. In an example, the first wavelength conversion material 531 may convert blue light into red light having a wavelength in a range of about 610 nm to about 650 nm.

The first wavelength conversion material 531 may be a quantum dot (QD), a quantum rod, or a fluorescent substance.

The quantum dot may mean a particle material which emits light having a specific or predetermined wavelength, while electrons are transferred from a conduction band to a valence band. The quantum dots may be semiconductor nanocrystalline materials. The quantum dots have a specific or predetermined band gap depending on their composition and size, and may emit light having an inherent band after absorbing light. Examples of the semiconductor nanocrystals of the quantum dots may include a Group IV based nanocrystal, a Group II-VI based compound nanocrystal, a Group III-V based compound nanocrystal, a Group IV-VI based nanocrystal, or a combination thereof.

The first base resin 532 may have high light transmittance and have excellent dispersion characteristic with respect to the first wavelength conversion material 531. For example, the first base resin 532 may include an organic material such as an epoxy-based resin, an acryl-based resin, a cardo-based resin, or an imide-based resin.

The first scattering material 533 may have a refractive index different from that of the first base resin 532, and may form an optical interface with the first base resin 532. The first scattering material 533 may be a light scattering particle. In an example, the first scattering material 533 may be a metal oxide particle or an organic particle.

The second wavelength conversion pattern 540 may be located in the emission area EMA of the second pixel PXL2 in a plan view. The second wavelength conversion pattern 540 may include a second wavelength conversion material 541, a second base resin 542, and a second scattering material 543.

The second wavelength conversion material 541 may convert a peak wavelength of incident light. In an example, the second wavelength conversion material 541 may convert blue light into green light having a wavelength in a range of about 510 nm to about 550 nm.

The second wavelength conversion material 541 may be a quantum dot (QD), a quantum rod, or a fluorescent substance.

The second base resin 542 may have high light transmittance and have excellent dispersion characteristic with respect to the second wavelength conversion material 541. For example, like the first base resin 532, the second base resin 542 may include an organic material such as an epoxy-based resin, an acryl-based resin, a cardo-based resin, or an imide-based resin.

The second scattering material 543 may have a refractive index different from that of the second base resin 542, and may form an optical interface with the second base resin 542. The second scattering material 543 may be a light scattering particle.

The first light transmission pattern 550 may be located in the emission area EMA of the third pixel PXL3 in a plan view. The first light transmission pattern 550 may include a third base resin 552 and a third scattering material 553.

The third base resin 552 may have high light transmittance and have excellent dispersion characteristic with respect to the third scattering material 553. For example, like the first base resin 532, the third base resin 552 may include an organic material such as an epoxy-based resin, an acryl-based resin, a cardo-based resin, or an imide-based resin.

The third scattering material 553 may have a refractive index different from that of the third base resin 552, and may form an optical interface with the third base resin 552. The third scattering material 553 may be a light scattering particle.

A capping layer 582 along with a color filter CF may seal the first wavelength conversion pattern 530, the second wavelength conversion pattern 540, and the first light transmission pattern 550, and accordingly, may prevent the first wavelength conversion pattern 530, the second wavelength conversion pattern 540, and the first light transmission pattern 550 from being damaged or contaminated due to penetration of a foreign matter such as moisture or air from the outside. The capping layer 582 may include at least one of an inorganic material and an organic material.

In an embodiment, the color conversion layer CCL may not be separated from the display element layer DPL by the capping layer 582. Referring to FIG. 6, the first wavelength conversion pattern 530, the second wavelength conversion pattern 540, and the first light transmission pattern 550 may be covered or overlapped by the light emitting element LD, an electrode configuration of the light emitting element LD, and the capping layer 582.

In accordance with an embodiment, a second bank BNK2 may be included, to define or form positions of the first wavelength conversion pattern 530, the second wavelength conversion pattern 540, and the first light transmission pattern 550. Like the black matrix BM, the second bank BNK2 may include a light blocking material or a reflective material.

The color filter layer CFL may include a light blocking pattern LBP and a plurality of color filters CF. The plurality of color filters may include a first color filter CF1, a second color filter CF2, and a third color filter CF3.

The light blocking pattern LBP may be located in the non-emission area NEA. The light blocking pattern LBP may be disposed along a boundary of the emission area EMA, and may block light transmission. The light blocking pattern LBP may include a light blocking material. In an example, the light blocking pattern LBP may be made of the same or similar material as the black matrix BM, but the disclosure is not limited thereto.

Any one of the plurality of color filters CF may allow light having a specific or predetermined wavelength to be selectively transmitted therethrough, and may absorb light having a wavelength different from the specific or predetermined wavelength. Light passing through the color filter CF may display one of three primary colors of red, green, and blue. However, a display color of light passing through the color filter CF is not limited to the primary colors, and the light passing through the color filter CF may display any one of cyan, magenta, yellow, and a white-based color.

The first color filter CF1 may be disposed in the emission area EMA of the first pixel PXL1. The first color filter CF1 may allow light of a first color to be transmitted therethrough, and may absorb light of a second color and light of a third color. The first color filter CF1 may include a colorant of the first color.

The second color filter CF2 may be disposed in the emission area EMA of the second pixel PXL2. The second color filter CF2 may allow light of the second color to be transmitted therethrough, and may absorb light of the first color and light of the third color. The second color filter CF2 may include a colorant of the second color.

The third color filter CF3 may be disposed in the emission area EMA of the third pixel PXL3. The third color filter CF3 may allow light of the third color to be transmitted therethrough, and may absorb light of the first color and light of the second color. The third color filter CF3 may include a colorant of the third color.

The upper substrate UPL may be disposed on the light control part LCP. The upper substrate UPL may include a material having a light transmissivity. The upper substrate UPL may be a rigid substrate or a flexible substrate. In an example, the upper substrate UPL may be a window member or an encapsulation substrate.

Hereinafter, a method of manufacturing a display device in accordance with an embodiment will be described later with reference to FIGS. 9 to 18.

Figure 9:
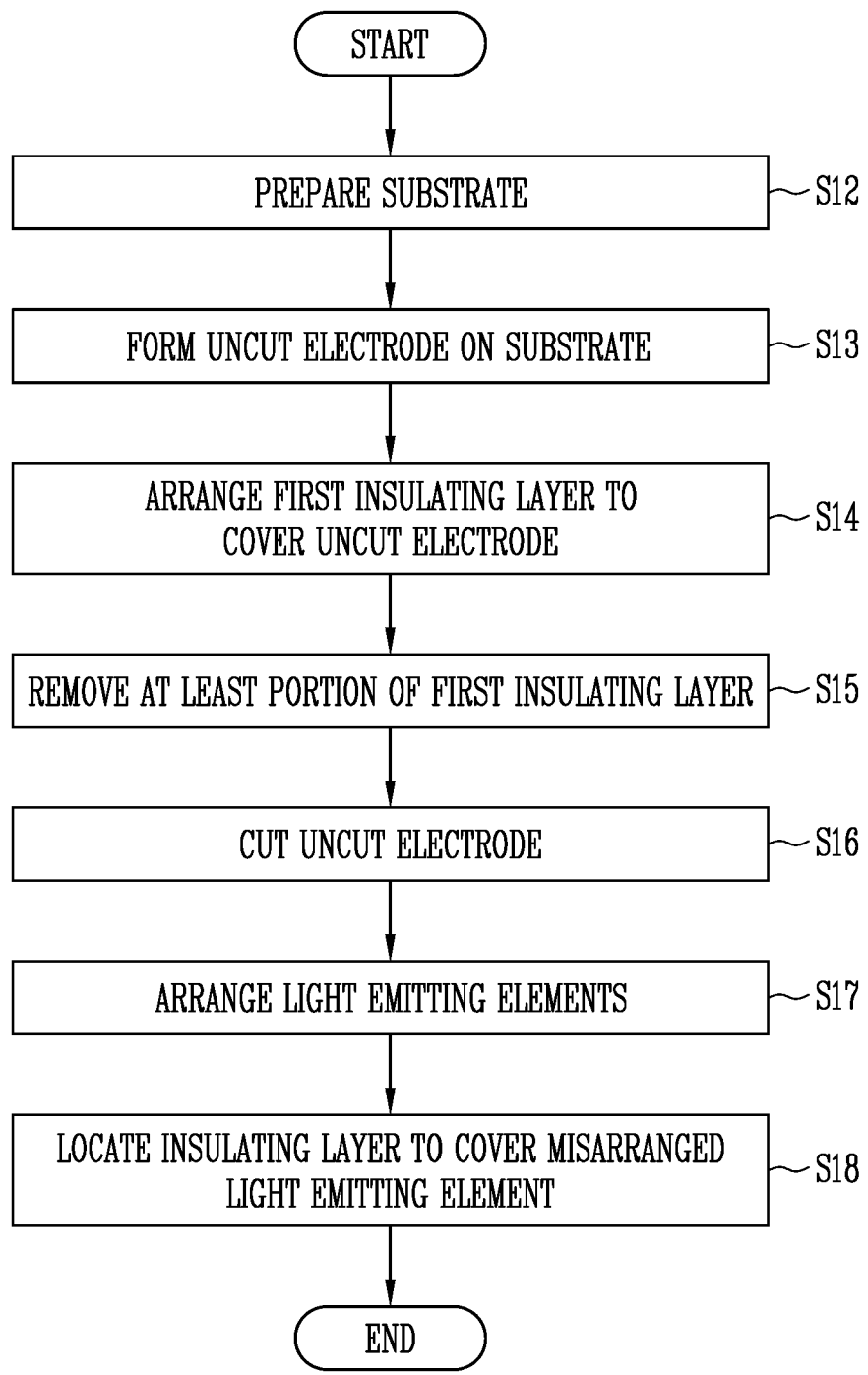
FIG. 9 is a flowchart illustrating a method of manufacturing a display device in accordance with an embodiment.
Figure 16:
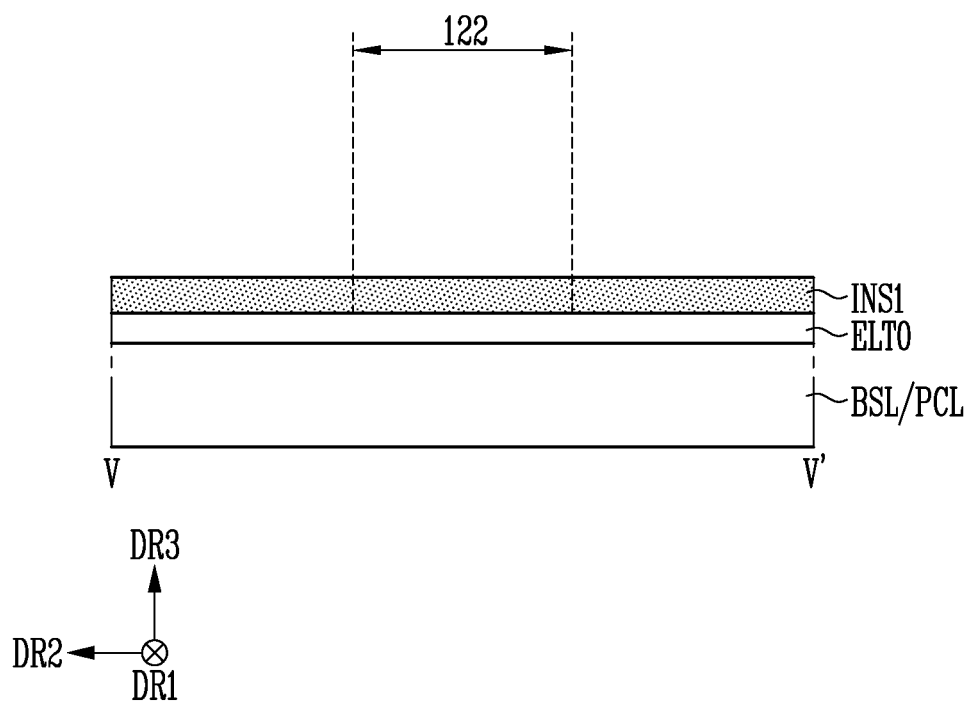
FIGS. 16 to 18 are schematic cross-sectional views taken along line V-V' shown in FIG. 5.
Figure 17:
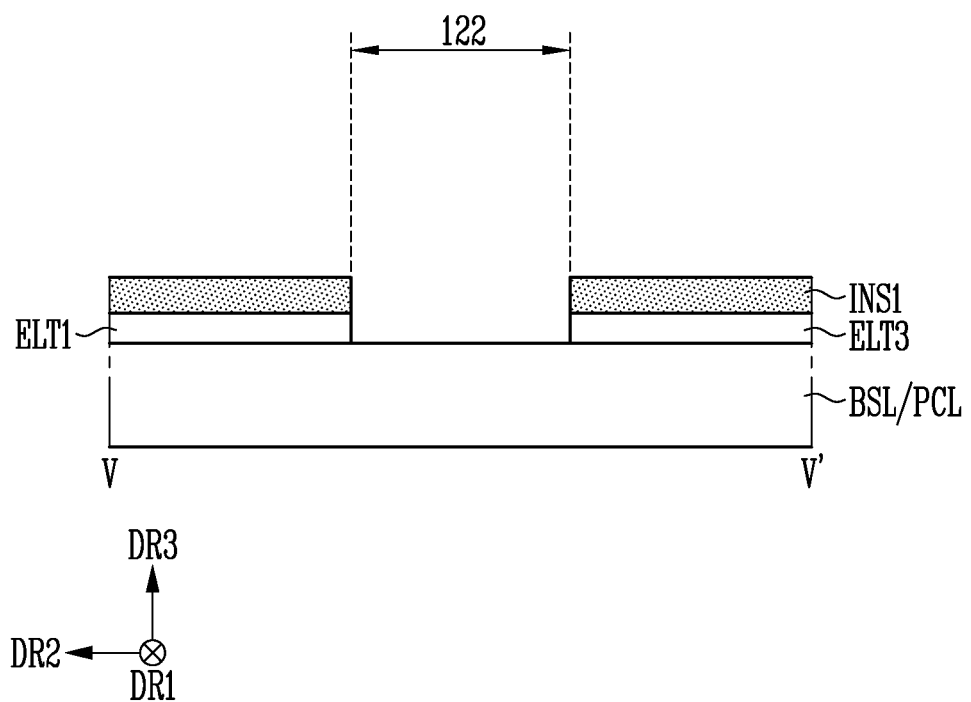
Figure 18:
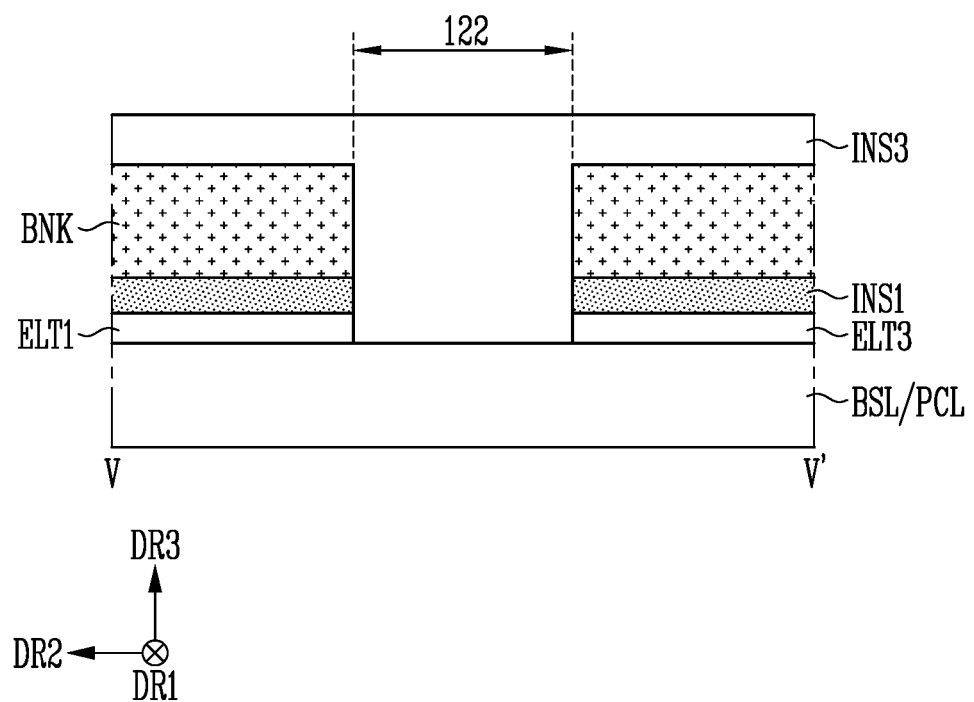

FIG. 9 is a flowchart illustrating a method of manufacturing a display device in accordance with an embodiment. FIGS. 10 to 13 are schematic cross-sectional views taken along line III-III' shown in FIG. 5. FIGS. 14 and 15 are schematic cross-sectional views taken along line IV-IV' shown in FIG. 5. FIGS. 16 to 18 are schematic cross-sectional views taken along line V-V' shown in FIG. 5. FIGS. 10 to 18 are process sectional views illustrating the method of manufacturing the display device in accordance with an embodiment.

FIGS. 9 to 18 may be views illustrating the open area 140 and the cut area 120. In FIGS. 9 to 18, for convenience of description, the open area 140 will be described based on the first open area 142 in the open area 140, and the cut area 120 will be described based on the first cut area or region 122 in the cut area 120.

Referring to FIG. 9, the method of manufacturing the display device in accordance with an embodiment may include preparing a substrate (S12), forming an uncut electrode on the substrate (S13), arranging or disposing a first insulating layer to cover or overlap the uncut electrode (S14), removing at least a portion of the first insulating layer (S15), cutting the uncut electrode (S16), arranging or disposing a light emitting element or light emitting elements (S17), and locating or disposing an insulating layer to cover or overlap a misarranged light emitting element (S18).

Figure 10:
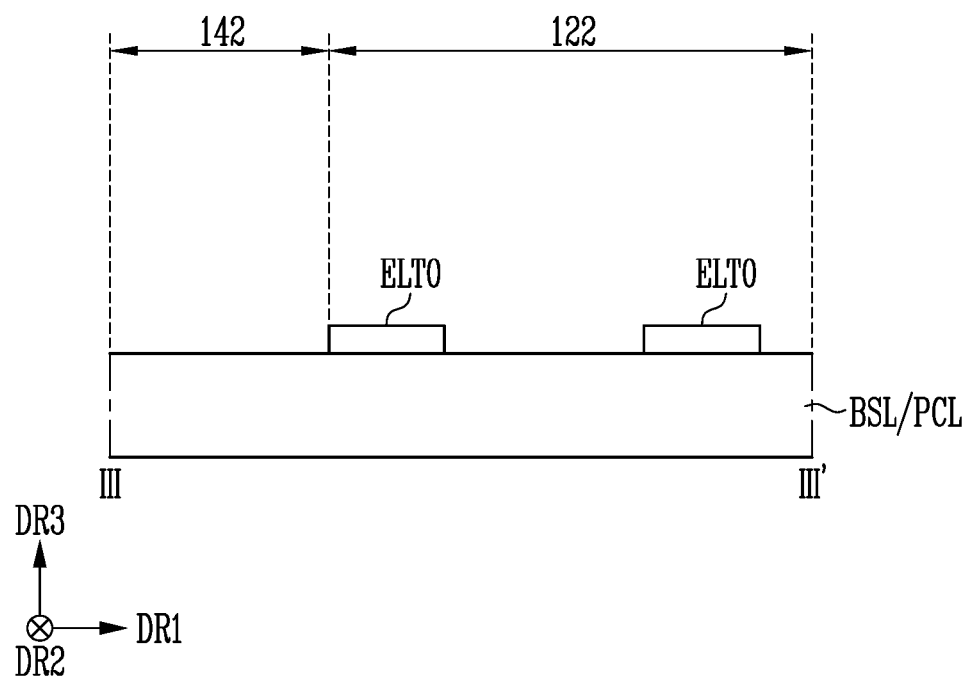
FIGS. 10 to 13 are schematic cross-sectional views taken along line III-III' shown in FIG. 5.

Referring to FIG. 10, in the preparing of the substrate (S12), a base layer BSL and a pixel circuit layer PCL located or disposed on the base layer BSL may be prepared. In an example, a circuit element CIE may be located or disposed on the base layer BSL. For example, the first to third transistors M1 to M3 and/or the storage capacitor Cst, which are described with reference to FIG. 4, may be arranged or disposed on the base layer BSL.

In the forming an uncut electrode on the substrate (S13), an uncut electrode ELT0 may be formed on the pixel circuit layer PCL. The uncut electrode ELT0 may mean an electrode component of which at least a partial area is physically cut in a subsequent process to form a pixel electrode, as described with reference to FIG. 5. In the forming an uncut electrode on the substrate (S13), the uncut electrode ELT0 may be arranged or disposed in the first cut area or region 122 in a plan view. The uncut electrode ELT0 may not be arranged or disposed in the first open area 142 in a plan view.

Figure 11:
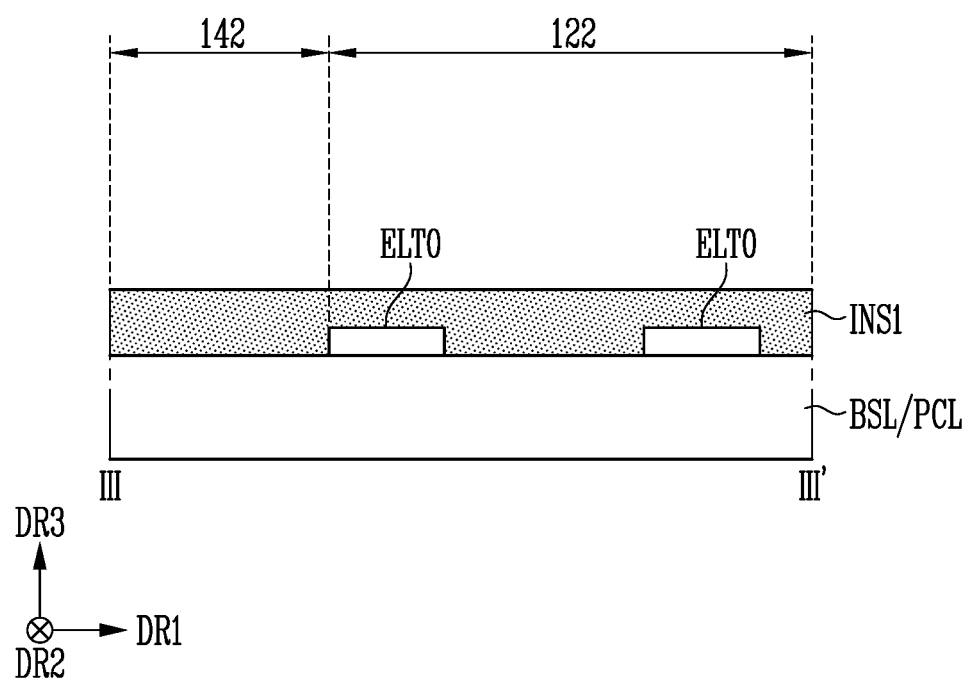

FIGS. 11 and 14, in the arranging of the first insulating layer INS1 (S14), the first insulating layer INS1 may be located or disposed on the pixel circuit layer PCL to cover or overlap the uncut electrode ELT0. At least a portion of the first insulating layer INS1 may be located in the first cut area or region 122 in a plan view, and at least another portion of the first insulating layer INS1 may be located in the first open area 142 in a plan view. The uncut electrode ELT0 may be covered or overlapped by the first insulating layer INS1 not to be exposed to the outside.

Figure 12:
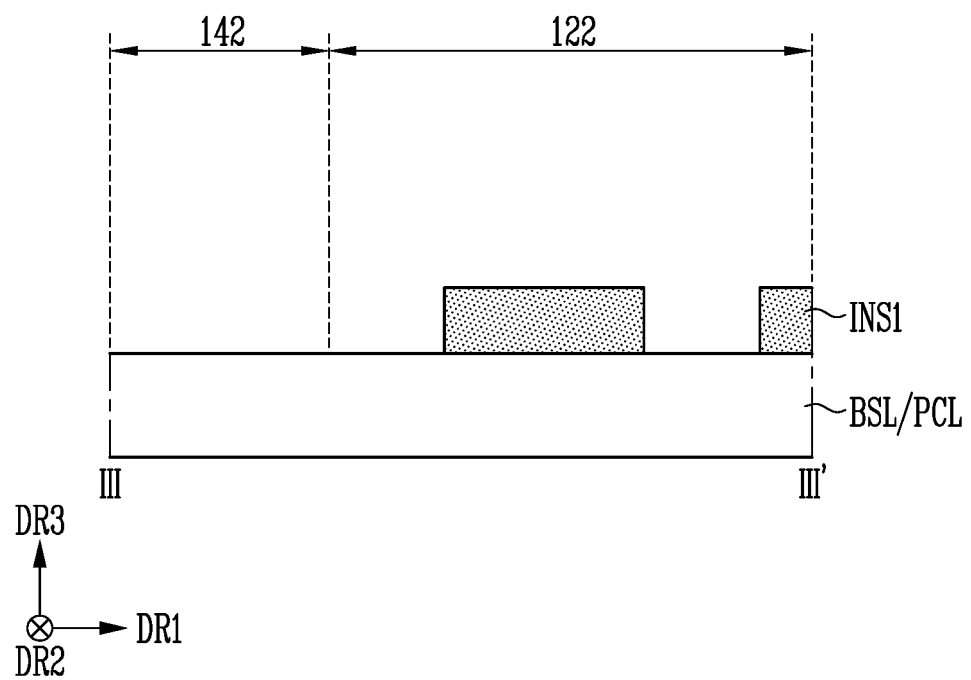

Referring to FIGS. 12, 15, and 17, in the removing at least a portion of the first insulating layer (S15), at least a portion of the first insulating layer INS1 may be removed. In the removing (S15), at least a portion of the first insulating layer INS1, which may be located in the first open area 142, and at least another portion of the first insulating layer INS1, which may be located in the first cut area or region 122, may be removed. Although a case where the whole of the first insulating layer INS1 arranged or disposed or located in the first open area 142 is removed has been illustrated in FIG. 12, the disclosure is not limited thereto.

In the cutting the uncut electrode (S16), at least a portion of the uncut electrode ELT0 may be removed. In a case that the uncut electrode ELT0 located in the first cut area or region 122 is removed, the uncut electrode ELT0 may not be arranged or disposed or located in the first cut area or region 122. In the cutting the uncut electrode (S16), in a case that the uncut electrode ELT0 in the first cut area or region 122 is removed, at least one of first to fourth electrodes ELT1 to ELT4 may be acquired. For example, referring to FIG. 17, in a case that at least a portion of the uncut electrode ELT0 is removed, individual electrode components, for example, the first electrode ELT1 and the third electrode ELT3, which may be physically separated from each other, may be provided.

In the cutting the uncut electrode (S16), a portion of at least one of the first to fourth electrodes ELT1 to ELT4 may be exposed. In the cutting (S16), a portion (for example, an end portion) of at least one of the first to fourth electrodes ELT1 to ELT4 may be exposed to the outside in the cut area 120. For example, referring to FIG. 17, in a case that the first insulating layer INS1 arranged or disposed or located in the first cut area or region 122 is removed, an end portion of each of the first electrode ELT1 and the third electrode ELT3 may be exposed.

In the cutting the uncut electrode (S16), any one of the first to fourth electrodes ELT1 to ELT4, of which at least a portion may be exposed to the outside, may be opened with respect to the open area 140. For example, in a case that the first insulating layer INS1 of the first open area 142 is removed, the first open area 142 may be adjacent to the exposed portion of each of the first electrode ELT1 and the third electrode ELT3.

In the arranging or disposing of the light emitting element (S17), the light emitting element LD may be provided or disposed. The arranging or disposing of the light emitting element (S17) may be performed after the first insulating layer INS1 arranged or disposed or located in the first open area 142 is removed. The light emitting element LD may be arranged or disposed or located on the first insulating layer INS1 in the emission area EMA as described with reference to FIGS. 5 and 6. It may be necessary for the light emitting element LD to be provided disposed in the emission area EMA, by way of example, a sub-emission area SEA in which the light emitting element LD is to be arranged or disposed or located. However, in an embodiment, in a case that the light emitting element LD is provided or disposed, the light emitting element LD may be arranged or disposed or located in an area except the area in which the light emitting element LD is to be arranged or disposed. For example, the light emitting element LD may include a normally arranged light emitting element and a misarranged light emitting element. The normally arranged light emitting element may be arranged or disposed or located in the emission area EMA, by way of example, a sub-emission area SEA in which the normally arranged light emitting element is to be arranged or disposed or located, and the misarranged light emitting element may be arranged or disposed or located in the non-emission area NEA. By way of example, the misarranged light emitting element may be arranged or disposed or located in the open area 140 and/or the cut area 120.

Since the light emitting element LD has electrical conductivity, the light emitting element LD may have a tendency that the light emitting element LD may be easily arranged or disposed or located at the periphery of a conductor component, at which an electric field may be formed. In accordance with an embodiment, in the arranging or disposing of the light emitting element (S17), at least a portion of the light emitting element LD may be arranged or disposed or located in the open area 140. For example, FIGS. 12, 15, and 17, the first open area 142 may be opened with respect to at least a portion (for example, an end portion) of each of the first electrode ELT1 and the third electrode ELT3, and the arranging or disposing of the light emitting element (S17) may be performed in a state in which at least a portion of the first electrode ELT1 and the third electrode ELT3 may be exposed. Therefore, the misarranged light emitting element arranged or disposed or located in an area except the sub-emission area SEA may be easily arranged or disposed or located in the first open area 142.

In the arranging of the light emitting element (S17), the light emitting element LD (by way of example, the misarranged light emitting element) may be preferentially arranged or disposed or located in the open area 140, as compared with the cut area 120. The light emitting element LD may be easily arranged or disposed or located on an area in which the circuit element CIE may be arranged or disposed or located thereunder. The circuit element CIE may not be located in the cut area 120 in a plan view. The circuit element CIE may be located in the open area 140 in a plan view. The open area 140 may be an area in which the circuit element CIE may be arranged or disposed or located thereunder or below, and may be an area opened (or adjacent) with respect to an electrode component exposed to the outside (for example, referring to FIG. 18, the first electrode ELT1 and the third electrode ELT3). For example, since the open area 140 is provided with both two factors having influence on a tendency that a misarranged light emitting element LD is arranged or disposed or located, the misarranged light emitting element LD may be preferentially arranged or disposed or located in the open area 140, as compared with the cut area 120.

In an example, in the misarranged light emitting element described with reference to the arranging of the light emitting element (S17), a first quantity of the misarranged light emitting element may be arranged or disposed or located in the cut area 120, and a second quantity of the misarranged light emitting element may be arranged or disposed or located in the open area 140. The second quantity may be greater than the first quantity.

Figure 13:
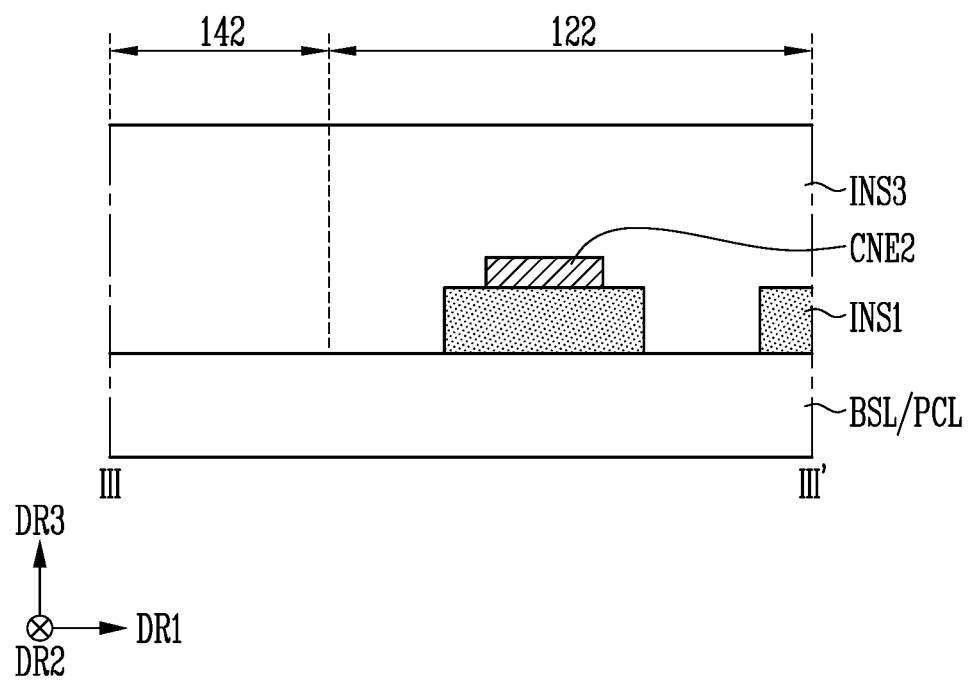
Figure 14:
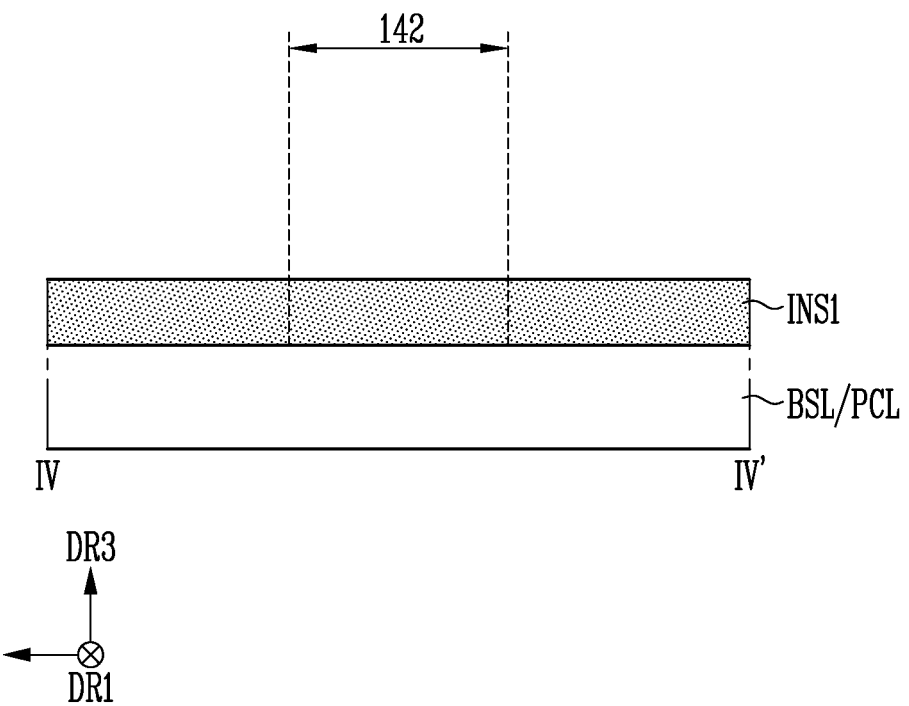

Referring to FIGS. 13, 15, and 18, in the locating of the insulating layer (S18), a second contact electrode CNE2 may be arranged or disposed or located on the first insulating layer INS1, a bank BNK may be arranged or disposed or located on the first insulating layer INS1, and a third insulating layer INS3 may be provided or disposed.

The third insulating layer INS3 arranged or disposed or located in the first cut area or region 122 may be located or disposed to cover or overlap the second contact electrode CNE2 and the first insulating layer INS1 (see FIG. 13), and the third insulating layer INS3 located in the first open area 142 may cover or overlap the first insulating layer INS1 and one or a surface of the first open area 142 which may not be covered or overlapped by the first insulating layer INS1 (see FIG. 15).

For example, surfaces/areas exposed to the outside may be covered or overlapped by the third insulating layer INS3. Before the locating of the insulating layer (S18) is performed, a portion of the light emitting element LD may be located in the open area 140, and the light emitting element LD located (for example, misarranged) in the open area 140 may be covered or overlapped by the third insulating layer INS3. For example, in the locating of the insulating layer (S18), the misarranged light emitting element defined with reference to the arranging of the light emitting element (S17) may be covered or overlapped by a predetermined insulating layer.

As described above, in the display device in accordance with an embodiment, the open area in which the misarranged light emitting element is preferentially arranged or disposed or located is set, so that the misarranged light emitting element LD may be concentrated on a specific or predetermined position. The light emitting element LD concentrated on the specific or predetermined position may be covered or overlapped by an insulating layer (for example, the third insulating layer INS3) applied in a subsequent process, and thus an electrical error including a short-circuit defect may be prevented.

In accordance with the disclosure, there is provided a method of manufacturing a display device and a display device manufactured thereby, in which an area may be provided, in which a misarranged light emitting element may be preferentially located or disposed, so that the reliability of optical inspection of the display device, and a short-circuit defect of a light emitting element may be prevented.

Effects of the disclosure are not limited to the above-described effects, and effects that are not mentioned will be clearly understood by those of ordinary skill in the art from the disclosure and the accompanying drawings.

Embodiments have been disclosed herein, and although terms are employed, they are used and are to be interpreted in a generic and descriptive sense only and not for purpose of limitation. In some instances, as would be apparent to one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A method of manufacturing a display device including an emission area and a non-emission area, wherein the non-emission area includes a first area and a second area, the method comprising:
   forming an uncut electrode on a substrate, wherein at least a portion of the uncut electrode is formed in the non-emission area;
   disposing a first insulating layer to overlap the uncut electrode;
   removing at least a portion of the first insulating layer in the non-emission area, wherein the removing of the at least a portion of the first insulating layer includes:
      removing the first insulating layer disposed in the first area; and
      removing the first insulating layer disposed in the second area;
   cutting the at least a portion of the uncut electrode in the non-emission area;
   disposing light emitting elements including a first light emitting element and a second light emitting element, wherein the first light emitting element is disposed in the emission area and the second light emitting element is disposed in an open area, and the disposing of the light emitting elements is performed after the removing of the first insulating layer disposed in the second area; and
   disposing a second insulating layer to overlap the emission area and the non-emission area wherein the second light emitting element is disposed where the uncut electrode is not disposed.

2. The method of claim 1, wherein
   each of the first area and the second area is an area in which the first insulating layer is removed in the removing of the at least a portion of the first insulating layer.

3. The method of claim 2, wherein
   the first area is an area in which the at least a portion of the uncut electrode is cut in the cutting of the at least a portion of the uncut electrode, and
   the second area does not overlap the first area in a plan view.

4. The method of claim 3, wherein the disposing of the light emitting elements includes:
   disposing a first quantity of the second light emitting element in the first area; and
   disposing a second quantity of the second light emitting element in the second area,
   wherein the second quantity of the second light emitting element is greater than the first quantity of the second light emitting element.

5. The method of claim 3, wherein, in the disposing of the second insulating layer, the second light emitting element disposed in the second area is overlapped by the second insulating layer.

6. The method of claim 3, wherein the cutting of the at least a portion of the uncut electrode includes:
   removing at least a portion of the uncut electrode disposed in the first area; and
   forming a first electrode and a second electrode that are physically separated from each other.

7. The method of claim 6, wherein, in the cutting of the at least a portion of the uncut electrode,
   at least a portion of each of the first electrode and the second electrode is exposed, and
   the second area is opened with respect to the at least a portion of each of the first electrode and the second electrode.

8. The method of claim 3, further comprising disposing a bank defining the emission area,
   wherein the bank is not disposed in the second area.

9. The method of claim 3, wherein
   the first light emitting element is disposed in a first direction, and the first area overlaps an area in which the first light emitting element is disposed along the first direction.

10. The method of claim 9, wherein the first area and the second area are disposed along a second direction intersecting the first direction.

11. The method of claim 10, wherein the first area and the second area are adjacent to each other along the second direction.

12. The method of claim 10, wherein the non-emission area is disposed in an area adjacent to the second area along the second direction.

13. The method of claim 3, further comprising disposing a transistor on the substrate,
   wherein a position of the transistor disposed in the disposing of the transistor does not overlap the first area in a plan view.

14. The method of claim 13, wherein the transistor overlaps the second area in a plan view.

* * * * *